(12) United States Patent
Abadeer et al.

(10) Patent No.: US 6,731,179 B2
(45) Date of Patent: May 4, 2004

(54) SYSTEM AND METHOD FOR MEASURING CIRCUIT PERFORMANCE DEGRADATION DUE TO PFET NEGATIVE BIAS TEMPERATURE INSTABILITY (NBTI)

(75) Inventors: Wagdi William Abadeer, Jericho, VT (US); Wayne Frederick Ellis, Jericho, VT (US); Patrick R. Hansen, Mansfield, MA (US); Jonathan M. McKenna, Ann Arbor, MI (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 10/063,295

(22) Filed: Apr. 9, 2002

(65) Prior Publication Data

US 2003/0189465 A1 Oct. 9, 2003

(51) Int. Cl.[7] .............................................. H03B 27/00
(52) U.S. Cl. ................. 331/57; 331/108 A; 331/177 R; 327/158; 324/769
(58) Field of Search ............................. 331/57, 108 A, 331/177 R; 327/158; 324/769

(56) References Cited

U.S. PATENT DOCUMENTS

| | | | |
|---|---|---|---|
| 5,379,321 A | | 1/1995 | Girmay |
| 5,448,205 A | * | 9/1995 | Rothermel ................... 331/57 |
| 5,457,336 A | | 10/1995 | Fang et al. |
| 5,532,175 A | | 7/1996 | Racanelli |
| 5,587,665 A | | 12/1996 | Jiang |
| 5,654,896 A | | 8/1997 | Ochi |
| 5,696,452 A | | 12/1997 | Hemmenway et al. |
| 5,900,741 A | | 5/1999 | Roohparvar |
| 6,047,247 A | | 4/2000 | Iwanishi et al. |
| 6,180,464 B1 | | 1/2001 | Krivokapic et al. |
| 6,272,439 B1 | * | 8/2001 | Buer et al. ................... 327/158 |
| 6,476,632 B1 | * | 11/2002 | La Rosa et al. ............ 324/769 |

FOREIGN PATENT DOCUMENTS

JP          200391991     * 3/2003

OTHER PUBLICATIONS

Srivastava et al. "InP HBT Ring Oscillator with 2.0ps/stage Gate Delay" Gallium Arsenide Integrated Circuit Symposium 2002, 24th Annual Technical Digest Oct. 20–23, 2002 pp 171–174.*

S. Ogawa and N. Shiono, "Generalized Diffusion–Reaction model for the Low–Field Change–Buildup Instability at the Si–SiO2 Interface," Phys. Rev. B, Vol. 51, pp. 4218–4230, 1995.

Wagdi W. Abadeer, William R. Tonti, Wilfried H. Hansch, and Udo Schwalke, "Long–Term Temperature Reliability of P+ Polysilicon Gated Devices," IEEE Transactions on Eilectron Deevices, vol. 42, No. 2, pp. 360–362, 1995.

Shigeo Ogawa, Masakazu Shimaya, and Noburu Shiono, "Interface–Trap Gerneration at Ultra–thin SiO2 (4–6 nm)–Si Interfaces During Negative–Bias Temperature Aging," J. Application Phys. 77 (3), Feb. 1, 1995, pp. 1137–1148, 1995.

G. LaRosa, F. Guarin, S. Rauch, A. Acovic, J. Lukaitis, and E. Crabbe, "NBTI–Channel Hot Carrier Effects in PMOS-FETS in Advanced CMOS Technologies," Proceedings of the 35th Annual IEEE International Reliability Physics Symposium (IRPS), pp. 282–286, 1997.

(List continued on next page.)

Primary Examiner—Michael B. Shingleton
(74) Attorney, Agent, or Firm—Richard A. Henkler, Esq.; McGinn & Gibb, PLLC

(57) ABSTRACT

A ring oscillator (and test circuit incorporating the ring oscillator and test method therefor) includes an odd number of elements interconnected in a serially-connected infinite loop, each oscillator element having an associated programmable delay feature. The circuit can be used to measure effects of Negative Bias Temperature Instability (NBTI) in p-channel MOSFETs (PFETs).

20 Claims, 20 Drawing Sheets

OTHER PUBLICATIONS

Toyoji Yamamoto, Ken ichi Uwasawa, and Tohru Mogami, "Bias Temperature Instability in Scaled P+ Polysilicon Gate p–MOSFET's," IEEE Transactions on Electron Devices, vol. 46, No. 5, pp. 921–926, 1999.

Mariko Makabe, Taishi Kubota, and Tomohisa Kitano, "Bias–Temperature Degradation of pMOSFETs: Mechanism and Suppression, "Proceedings of the 38th Annual IEEE International Physics Symposium (IRPS), pp. 205–209, 2000.

C.H. Liu, Y.F. Chen, S.K. Fan, M.T. Lee, M.H. Lin, C.H. Chou, W.C. Chang, S.C. Huang, Y.J. Cjang, and K.Y. Fu, "Negative Bias Temperature Instability (NBTI) in Deep Sub–Micron P+ Gate pMOSFETs," Proceedings of the International Integrated Reliability Workshop, pp 98–100, 2000.

* cited by examiner

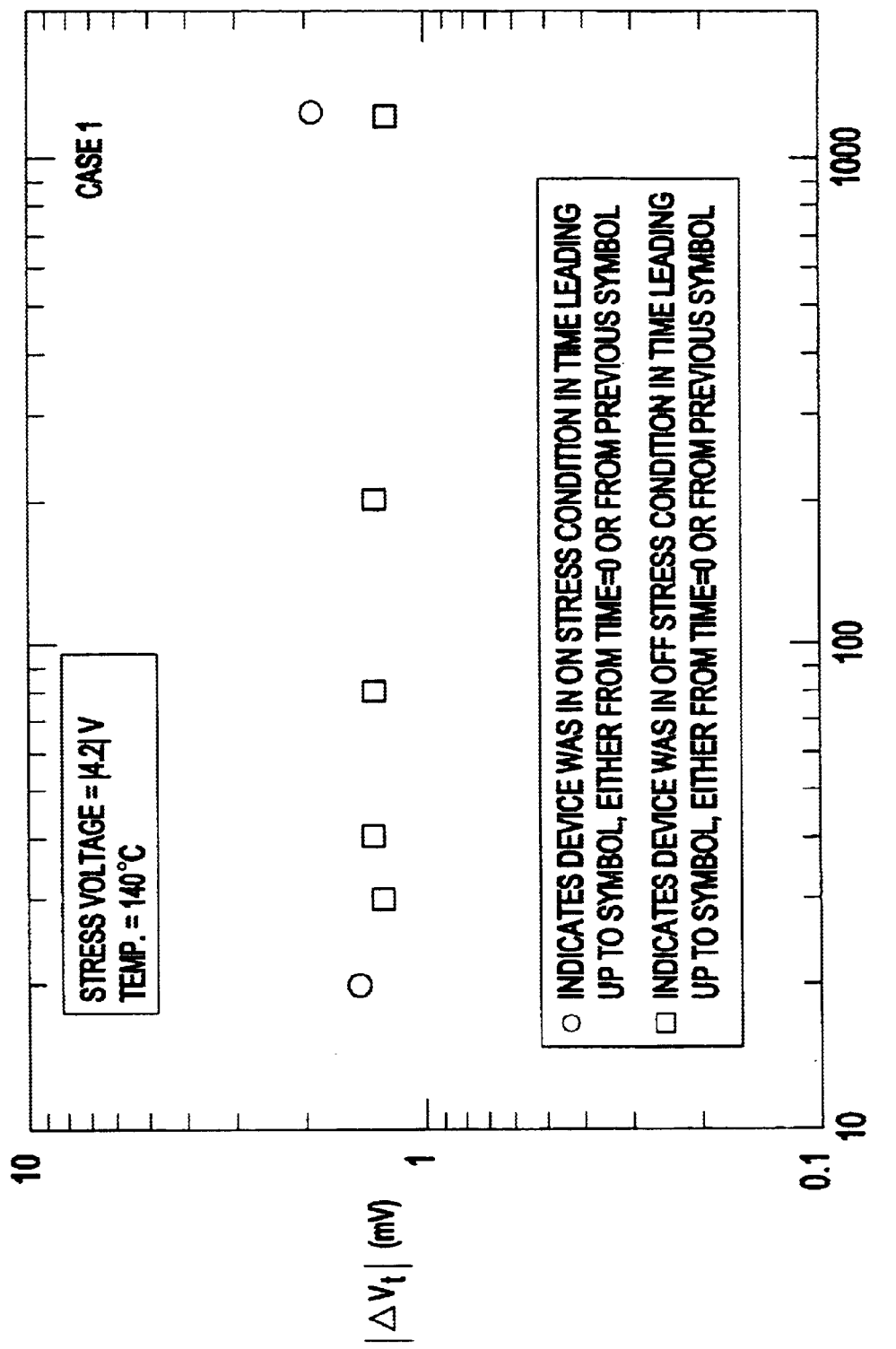

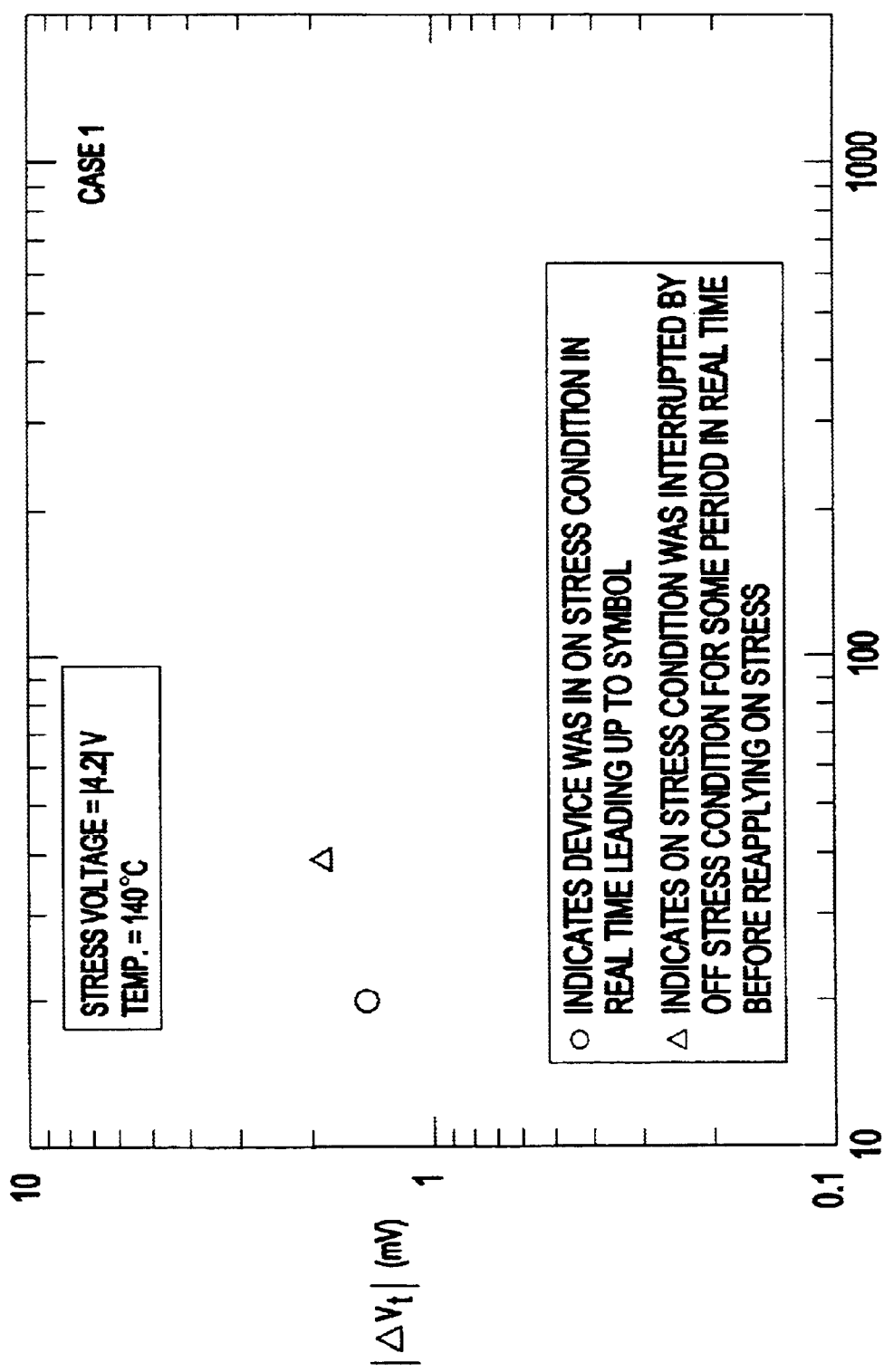

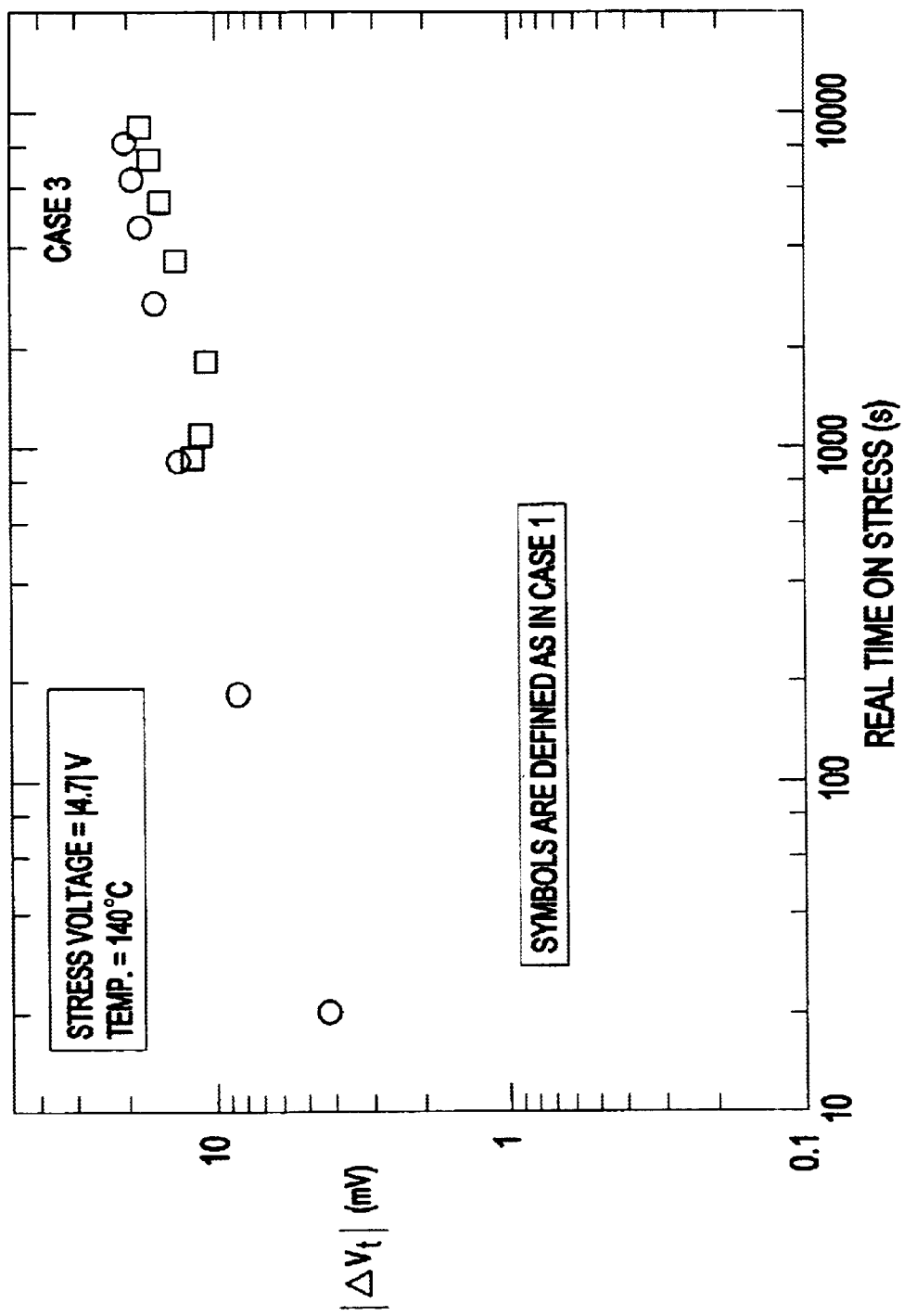

SYSTEM AND METHOD FOR MEASURING CIRCUIT PERFORMANCE DEGRADATION DUE TO PFET NEGATIVE BIAS TEMPERATURE INSTABILITY (NBTI)

BACKGROUND OF THE INVENTION

1. Field of the Invention

The present invention relates to a test device and method for measuring the true effects of negative bias temperature instability (NBTI) of PFETs (p-channel field effect transistors).

2. Description of the Related Art

High performance PFETs (p-channel field effect transistors) with p+ polysilicon doped gates have been found to exhibit an instability after voltage/temperature aging. This phenomenon is known as "negative bias temperature instability" (NBTI). The instability occurs under negative gate voltage and is measured as an increase in the magnitude of threshold voltage of the device. Higher stress temperatures produce more degradation. The mechanism is known to cause reliability performance degradation for the PFET because of this change in threshold voltage.

Several physical models have been proposed in the literature. Basically, an electro-chemical reaction presumably occurs in the gate oxide, due to sensitivity of p+ gates to moisture trapping. The result is a net positive charge in the gate oxide, causing a bias effect that affects threshold voltage.

The degradation caused is exponential with oxide electric field. This problem is getting much worse with each generation of CMOS scaling in which oxide thickness is aggressively scaled down but voltage scaling does not keep pace with the oxide thickness scaling. The mechanism, therefore, becomes a major technology reliability scaling problem.

A relaxation of the degradation has been observed when the DC stress is turned "OFF" following an "ON" stress. Relaxation is a phenomenon known to occur in charge trapping mechanisms.

A stress bias configuration of the PFET 10 is shown in FIG. 1, where a positive voltage 16 is applied to the diffusions 13,14 and the N-well 12 while the gate 15 of the PFET is at ground potential. This stress bias configuration can alternatively be replaced by the configuration shown in FIG. 2 where a negative voltage 21 is applied to the gate while all other terminals of the FET are at ground.

FIG. 3 shows the effect of stress on the drain-to-source current versus gate voltage characteristic 30 of the FET 10. The bias temperature aging under the configuration of FIG. 1 produces an increase 31 in the absolute value of the threshold voltage ($\Delta V_{th}$), which in turn causes a decrease in the drain-to-source current ($I_d$) for a given gate-to-source voltage ($V_g$). Again, this PFET device instability is usually referred to as a negative bias temperature instability (NBTI) since it requires the applications of a negative gate voltage for the mechanism to be active. The change in threshold voltage and the corresponding decrease in device current could cause signal delay or performance degradation in operating circuits utilizing such devices.

There are numerous publications dealing with the characteristics, behavior and physics of the NBTI mechanism. From this literature, it is found that the magnitude of change in threshold voltage after stress for a time duration $t$ under gate voltage of $V$ and temperature $T$ is given by:

$$|\Delta V_{th}| = A\, e^{(-\Delta H/KT)} e^{(-\gamma T_{ox}/V)} t^n \quad \text{(Equation 1),}$$

where $|\Delta V_{th}|$ is the magnitude of final threshold voltage value after stress minus its initial value before stress; $A$, $\gamma$, and $n$ are constants (positive values) that are dependent upon the particular technology in question; $\Delta H$ is referred to as the activation energy; $T_{ox}$ is the oxide thickness, and $K$ is Boltzmann's constant.

FIG. 4 shows a typical behavior of $|\Delta V_{th}|$ with a straight line relationship (slope=n) versus time on a log—log scale, as predicted by equation (1). The behavior of the NBTI mechanism described in the literature is the DC stress mode where the stress conditions of FIG. 1 are applied. This DC stress mode of FIG. 1 will be referred to as the "ON" stress condition, and the behavior of $|\Delta V_{th}|$ in this case is given by equation (1).

The increase in the absolute value of the threshold voltage due to the NBTI mechanism is a serious technology reliability problem because it leads to performance degradation and subsequent failure of semiconductor integrated chips. Because this mechanism depends on oxide thickness, as shown in the above equation 1, the degradation caused by the NBTI becomes worse as the oxide thickness is reduced (i.e., as CMOS technology scaling continues and as the drive for better performance intensifies). An important aspect of dealing with this problem is the ability to determine the actual impact of this mechanism on the reliable performance of integrated chips where devices are mostly subjected to pulsed voltage conditions rather than DC conditions.

This is illustrated in FIG. 5, which shows a simple CMOS inverter 50 where the input voltage changes from ground potential to a value of V with a period of $\tau$, and the output voltage is the complement of the input. Excluding transient conditions, the PFET of this CMOS inverter is subjected to two stress configurations. The first configuration is when the output voltage is equal to V, i.e., the gate of the PFET is at ground, and this condition is what has been referred to as the "ON" stress condition.

The second configuration, as shown in FIG. 6, is referred to as the "OFF" stress condition, i.e., when the gate 15 of the PFET 10 is at voltage V, one diffusion is also at voltage V while the other diffusion is at ground. But, as mentioned above, the behavior of the NBTI mechanism is represented by equation (1) as a DC "ON" stress.

More realistic to the actual operation of the CMOS inverter, the more realistic question is that of asking what happens to the device under conditions of an "ON" stress, followed by an "OFF" stress. FIG. 7A (Case 1) shows the behavior of $|\Delta V_{th}|$ versus time when the PFET is subjected to an "ON" stress (A) for a duration of 20 seconds, followed by an "OFF" stress (B) for a duration of 1200 seconds with measurements of $|\Delta V_{th}|$ (readouts) at 10 sec, 20 sec, 60 sec., 180 sec., and 1200 sec. (all measured from the start of the "OFF" stress), and then followed by another "ON" stress (A') for a duration of 20 seconds. The magnitude of the stress voltage was 4.2 V, and the stress temperature was 140° C.

Even though the magnitude of the threshold voltage shift (C) was small under these conditions, it is noticeable that the "OFF" stress following the "ON" stress caused $|\Delta V_{th}|$ to decrease measurably. Thus, there is some relaxation effect due to the "OFF" stress following the "ON" stress.

In FIG. 7B, the behavior of Case 1 shown in FIG. 7A was replotted. This time the effective time (A, A') under "ON" stress condition is indicated on the X-axis of the plot (meaning that all time intervals for "OFF" stress were not included on the X-axis). The Y-axis for $|\Delta V_{th}|$ of FIG. 7B includes the relaxation effect of the "OFF" stress. It is clear that the behavior of the PFET under pulsed voltage conditions, i.e., repeated combinations of "OFF" and "ON"

stressing, would be more complicated than the DC model under "ON" stress, and thus it would be extremely difficult to theoretically predict the actual effect of the NBTI mechanism on the performance of CMOS integrated circuits, and to determine the effect of technology scaling and the effect of different processing conditions.

Thus, a system needs to be developed to determine the impact of the NBTI reliability mechanism on the performance of CMOS integrated circuits, under any conditions of cycle time ($\ddot{I}_m$), which is the sum of the intervals for the "ON" plus "OFF" stresses ($\ddot{I}_m$=1/f, where f is the frequency or performance), duty factor (DF), which is "ON" time relative to cycle time, and technology processing. Prior to the present invention, no such system has been known.

FIG. 8 illustrates the use of appliqués to realize a flow disturbance structure

BRIEF SUMMARY OF THE INVENTION

The present invention solves the above stated problem by introducing a test circuit and method which can be used to measure the impact of NBTI reliability failure mechanism on the performance of CMOS products. As will be explained in more detail below, the present inventors have found that under a series of "ON" and "OFF" stresses, the degradation behavior for the mechanism deviates from that predicted by the DC model. From both the underlying physics and actual bench stressing testing, it has been found by applying an AC-like stressing that a deviation occurs from the DC results. The deviation depends on frequency and duty factor of the AC stress test.

This invention provides a technology for determining the true and realistic effects of the NBTI mechanism. It is also vital to provide a technology to determine the actual effect and extent of degradation on functional circuits. The test system disclosed as part of this invention also accomplishes this second result. It is, therefore, an object of the present invention to provide a structure and method for accurately measuring the effects of the NBTI mechanism on CMOS.

It is another object of the present invention to teach a method of investigating the true effects of the NBTI mechanism using DC stress and AC stress testing techniques, either alone or in combination.

It is another object of the present invention to teach a test circuit and method of investigating the NBTI mechanism by providing the capability to systematically investigate a change in test parameters, including among others, cycle time, duty factor, voltage, temperature, and stress time.

It is another object of the present invention to teach a method of determining circuit reliability by including measurement of NBTI effects.

It is another object of the present invention to teach a method of in-line reliability testing of manufactured hardware in which disposition criteria are set up to include NBTI measurements.

The back side 26 further comprises a flow disturbance structure 34 that imparts a rippling effect to water that flows over the back side 26. The flow disturbance structure 34 is a series of substantially parallel grooves 36 of rectangular cross-section that are separated by a series of substantially parallel lands 38. The flow disturbance structure 34 is created by removing material from whatever material is used for the substrate 12 to create the grooves 36 and thereby create the lands 38. If a different rippling effect is desired, grooves with a different spacing, depth and/or profile (e.g., saw tooth) than the grooves 36 can be created. Further, grooves that are not parallel to one another can also be used to create a different rippling effect. It should also be appreciated that flow disturbance structures other than the flow disturbance structure 34 are possible. For instance, a flow disturbance structure of hemispherical blisters, pyramids, "moons" etc. or combinations there are possible. Further, it should also be appreciated that comparable flow disturbance structures can be realized by applying material to whatever material is used to create the substrate. For example, FIG. 8 illustrates the same flow disturbance structure 34 as shown in FIG. 4 but with the grooves 36 and lands 38 realized by the adherence of appliqués 92 to the substrate 12.

It is another object of the present invention to teach a method of measuring NBTI effects by correlation of a ring oscillator frequency with a shift in threshold voltage of a PFET.

It is another object of the present invention to teach a ring oscillator having an odd number of circuit elements, each having a programmable delay.

It is another object of the present invention to teach a ring oscillator having a variable duty cycle.

It is another object of the present invention to teach a ring oscillator having an odd number of circuit elements, each element being a non-inverting buffer stage.

It is another object of the present invention to teach a ring oscillator having a feature that oscillation can be started using an input control signal.

It is another object of the present invention to teach a ring oscillator with elements having a programmable delay and the programmable delay controlled by a binary word input.

It is another object of the present invention to teach an NBTI test method in which a single PFET is targeted by having a single one of the targeted PFETs incorporated in each stage of a ring oscillator.

It is another object of the present invention to teach a method of determining the magnitude and behavior of the degradation due to the NBTI mechanism under any desired AC conditions of voltage, duty factor, and frequency of any intended circuit applications.

It is another object of the present invention to teach a method that permits a determination of the difference between the degradation due to the NBTI mechanism under DC and AC conditions.

It is another object of the present invention to teach a method to determine the effect of the degradation due to the NBTI mechanism on technology scaling under actual AC operating conditions and from which an optimum and realistic path for technology scaling could be arrived at.

It is another object of the present invention to teach a procedure and methodology according to which a reliability in-line manufacturing control system is achieved to protect manufactured goods from any undesired degradation due to the NBTI mechanism.

To achieve the above goals and objectives, as a first aspect of the present invention, described herein is a ring oscillator including an odd number of elements interconnected in a serially-connected infinite loop, each element having an associated programmable delay feature.

As a second aspect of the present invention, described herein is a test circuit to measure a Negative Bias Temperature Instability (NBTI) effect for PFETs (p-channel MOSFET) by stressing a target PFET component with at least one stress condition, the target PFET component being integrated as a component into the test circuit, the target PFET component having a source, a drain, and a gate, the test circuit including a ring oscillator having an odd number of oscillator elements interconnected serially in an infinite loop, wherein at least one the target PFET component is integrated into the ring oscillator and a test output providing a point to measure at least one parameter of the ring oscillator.

As a third aspect of the present invention, described herein is a method of testing a PFET (p-channel field effect transistor) by incorporating a target PFET into a ring oscillator having an odd number of elements, performing at least one stress test on the PFET, and measuring at least one characteristic of at least one of the PFET and the ring oscillator.

BRIEF DESCRIPTION OF THE SEVERAL VIEWS OF THE DRAWINGS

The foregoing and other objects, aspects and advantages will be better understood from the following detailed description of a preferred embodiment of the invention with reference to the drawings, in which:

FIG. 7A shows the behavior of $|Î"V_{th}|$ versus time when the PFET is subjected to an "ON" stress for a duration of 20 seconds, followed by an "OFF" stress for a duration of 1200 seconds (Case 1);

FIG. 7B shows a replotting of the data in FIG. 7A;

FIG. 9A shows the behavior of $|Î"V_{th}|$ versus real (actual) stress time for Case 3;

DETAILED DESCRIPTION OF THE INVENTION

In order to determine the needed features of the subject test system, the effects of cycle time and duty factor on the NBTI degradation mechanism need to be investigated. The following three cases (Case 2 through Case 4) are discussed.

Figure 8A:
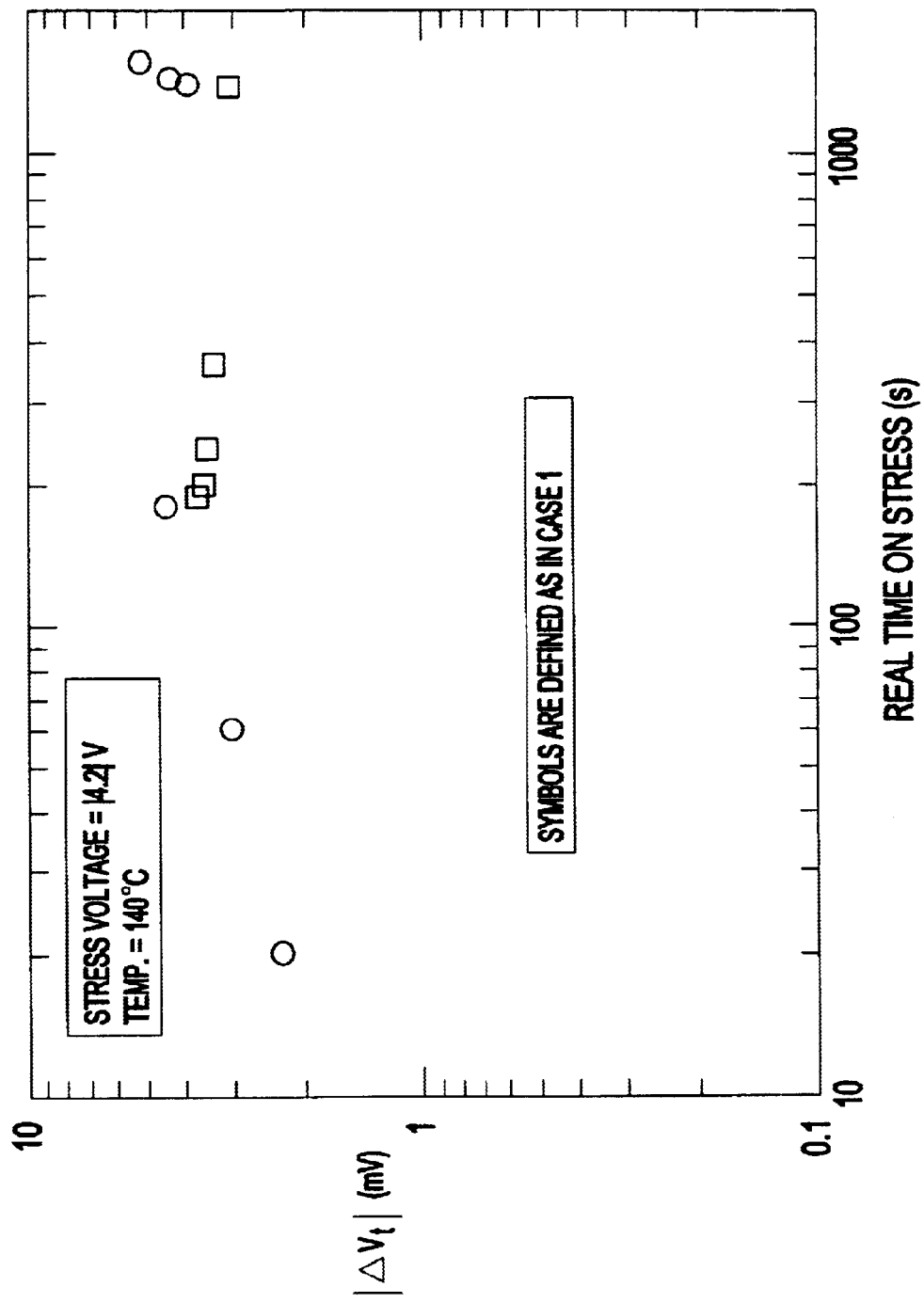
FIG. 8A shows the behavior of $|Î"V_{th}|$ versus real (actual) stress time for Case 2.

Referring first to FIG. 8A, the behavior of $|Î"V_{th}|$ versus real (actual) stress time is shown for Case 2. Here, an "ON" stress (A) was conducted at a magnitude of stress voltage of 4.2 V, 140Â° C., for a total duration of 180 seconds, with readouts at 20, 60, and 180 seconds. The configuration was then switched to an "OFF" stress (B), still at 4.2 V and 140Â° C., for total duration of 1200 seconds (measured from the start of the "OFF" stress) with readouts at 10, 20, 60, 180, and 1200 seconds. The stress was then switched back to the "ON" condition (A'), at the same voltage of 4.2 V and 140Â° C., for a total duration of 180 seconds, with readouts at 20, 60, and 180 seconds. Thus, for the second case the period Î.., which is the sum of the intervals for the "ON" plus "OFF" stresses, was 1,380 seconds. In the first case, Î.., was 1,220 seconds. The duty factor for Case 2 was 0.13 versus 0.016 for Case 1. Thus, the duty factor for Case 2 was significantly higher than for Case 1.

Figure 8B:
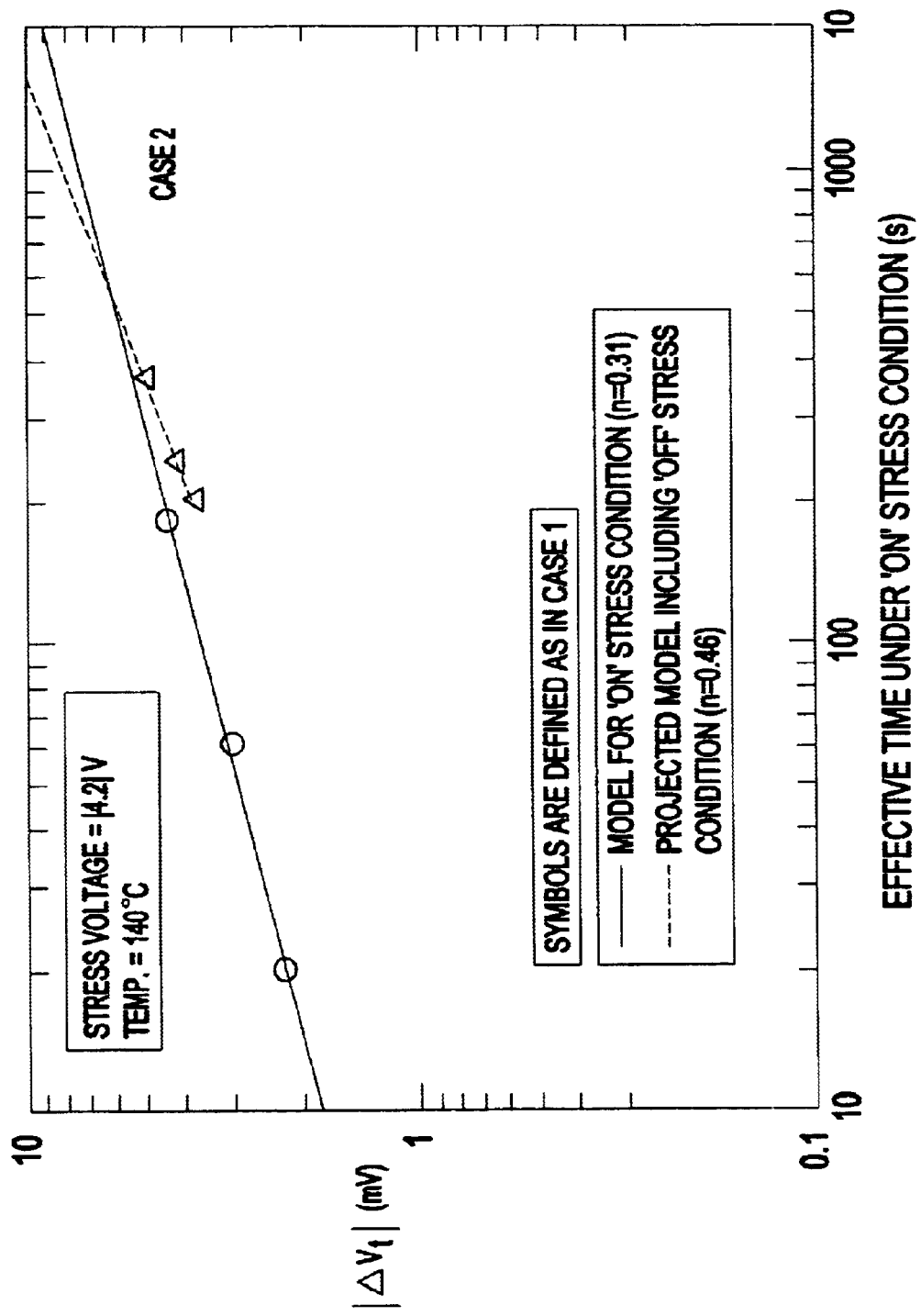
FIG. 8B shows $|Î"V_{th}|$ plotted vs the effective time under "ON" stress condition for Case 2, where the time intervals for the "OFF" stress were not included.

In FIG. 8B the behavior of $|Î"V_{th}|$ is plotted vs the effective time under "ON" stress condition (A, A') where the time intervals for the "OFF" stress were not included. From FIGS. 8A and 8B it is noted that there is a definite relaxation effect, i.e., reduction in $|Î"V_{th}|$, when the "OFF" stress is applied following the "ON" stress, as was found in Case 1.

Another significant observation is made for Case 2. In FIG. 8B, the behavior of $|Î"V_{th}|$ for the first readouts (three readouts, represented by open circles) in FIGS. 8A and 8B during the "ON" stress, up to and including time at 180 seconds are modeled by a straight line 80 on a log—log scale as predicted by equation (1), with a value n =0.31, which is the time exponent factor for the power law relationship between $Î"V_{th}$ and time.

The three readouts for the "ON " stress following the "OFF" stress (three triangles in FIG. 8B), however, show a different behavior. As shown in FIG. 8B the straight line model 81 representing the "ON" stress following the "OFF" stress have a steeper slope with a time exponent factor of 0.46 versus 0.31 for the case where the "ON" stress was not proceeded with an "OFF" stress. Thus, the behavior shown in FIG. 8B suggests that following the relaxation effect of the "OFF" stress, the steeper slope of the "ON" stress will cause the $|Î"V_{th}|$ to exceed the value it would have, had the "OFF" stress not taken place. This complicated behavior raises a legitimate question regarding the actual behavior for $|Î"V_{th}|$ under repeated application of "ON" and "OFF" stressing.

FIG. 9A shows the behavior of $|Î"V_{th}|$ versus real (actual) stress time for Case 3. Here the magnitude of the stress voltage was increased to 4.7 V at 140Â° C. so that the values of $|Î"V_{th}|$ become more significant than in previous cases. For this third case, first an "ON" stress (A) was applied for a duration of 900 seconds with readouts at 20, 180, and 900 seconds. The configuration was then switched to an "OFF" stress (B), still at 4.7 V and 140Â° C. for a total duration of 900 seconds (measured from the start of the "OFF" stress) with readouts at 20, 180, and 900 seconds. This procedure of an "ON" stress followed by an "OFF" stress, each for a duration of 900 seconds, was repeated four more times for a total of five cycles of "ON" followed by "OFF" stresses (A'–B''''). Thus, for Case 3, the period $\ddot{I}_{41}$ was 1800 seconds and the duty factor was 0.5 versus 0.13 for Case 2 and 0.016 for Case 1.

Figure 9B:
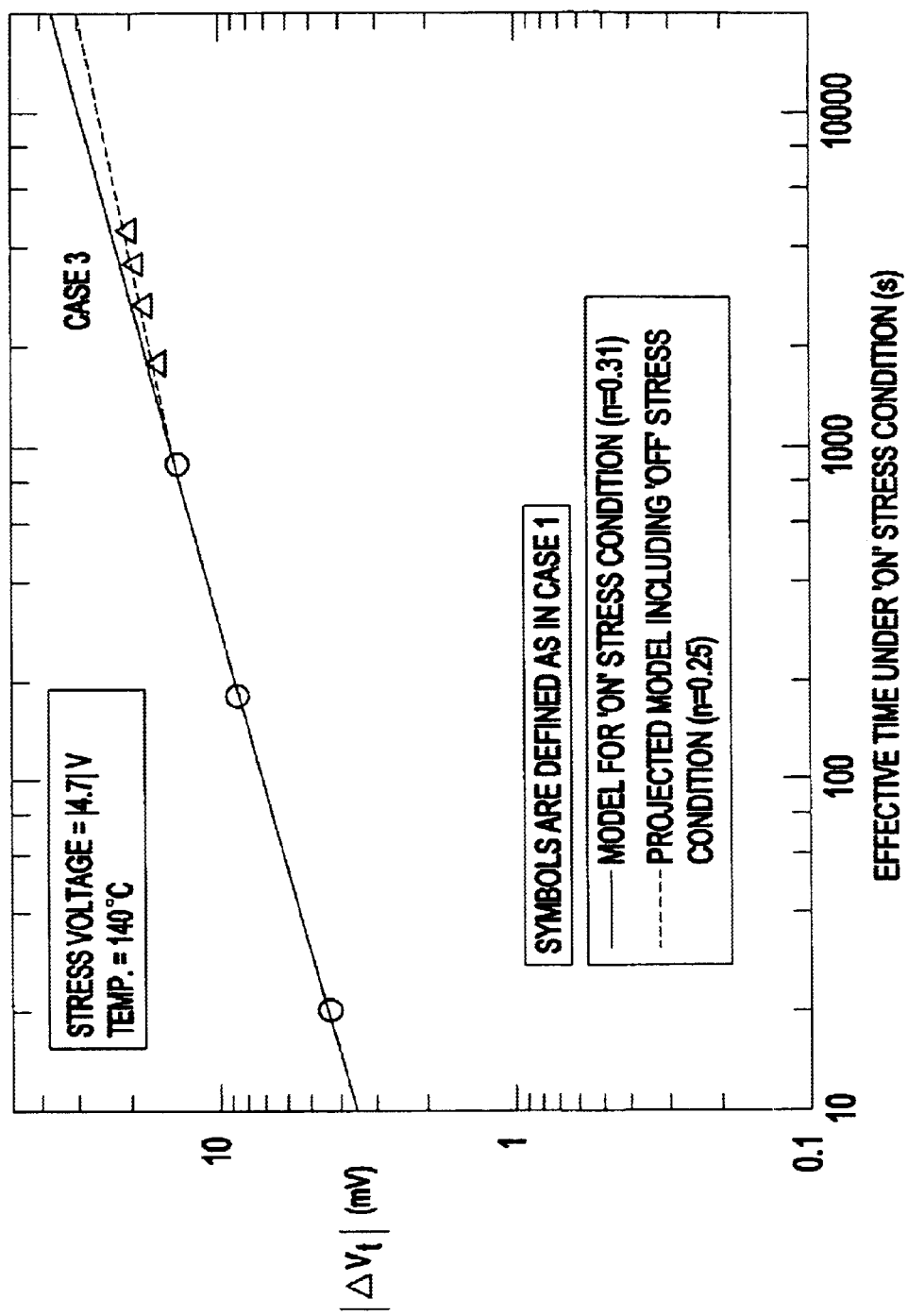
FIG. 9B shows $|Î"V_{th}|$ versus effective time under "ON" stress for Case 3.

In FIG. 9B the behavior of $|\hat{I}"V_{th}|$ for the first readouts (three readouts represented by open circles in FIGS. 9A and 9B during the "ON" stress, up to and including time at 900 seconds, are modeled by a straight line 90 on a log—log scale as predicted by equation (1), with n=0.31 (same as for case 2 during the "ON" stress), which is the time exponent factor for the power law relationship between $|\hat{I}"V_{th}|$ and time. The four readouts for the "ON" stresses following the "OFF" stresses (triangles in FIG. 9B), however, again show a different behavior. As shown in FIG. 9B the straight line model 91 representing the "ON" stresses following the "OFF" stresses have a shallower slope with a time exponent factor of 0.25 versus 0.31 for the case where the "ON" stress was not proceeded with an "OFF" stress. Also, another significant observation is made, which is that the time exponent factor for "ON" stresses when proceeded with "OFF" stresses decreased from 0.46 for Case 2 to 0.25 for Case 3, and in this last case the exponent was less than 0.31, which is the value obtained when the "ON" stresses were not interrupted by "OFF" stressing. The conclusion for the data is that, again, the effect of the "ON" stressing followed by "OFF" stressing, depending on the exact conditions of time intervals and duty factors, may lead to a higher or lower net $|\hat{I}"V_{th}|$ than what is predicted by "ON" stressing alone without interruptions by "OFF" stressing.

Finally, a fourth case is presented, this time using pulsed voltage conditions at a frequency of 2.5 MHz and a duty factor of 0.5 (similar to Case 3) to simulate actual operating conditions for an inverter to investigate the AC behavior of the PFET degradation due to the NBTI mechanism.

Figure 10:
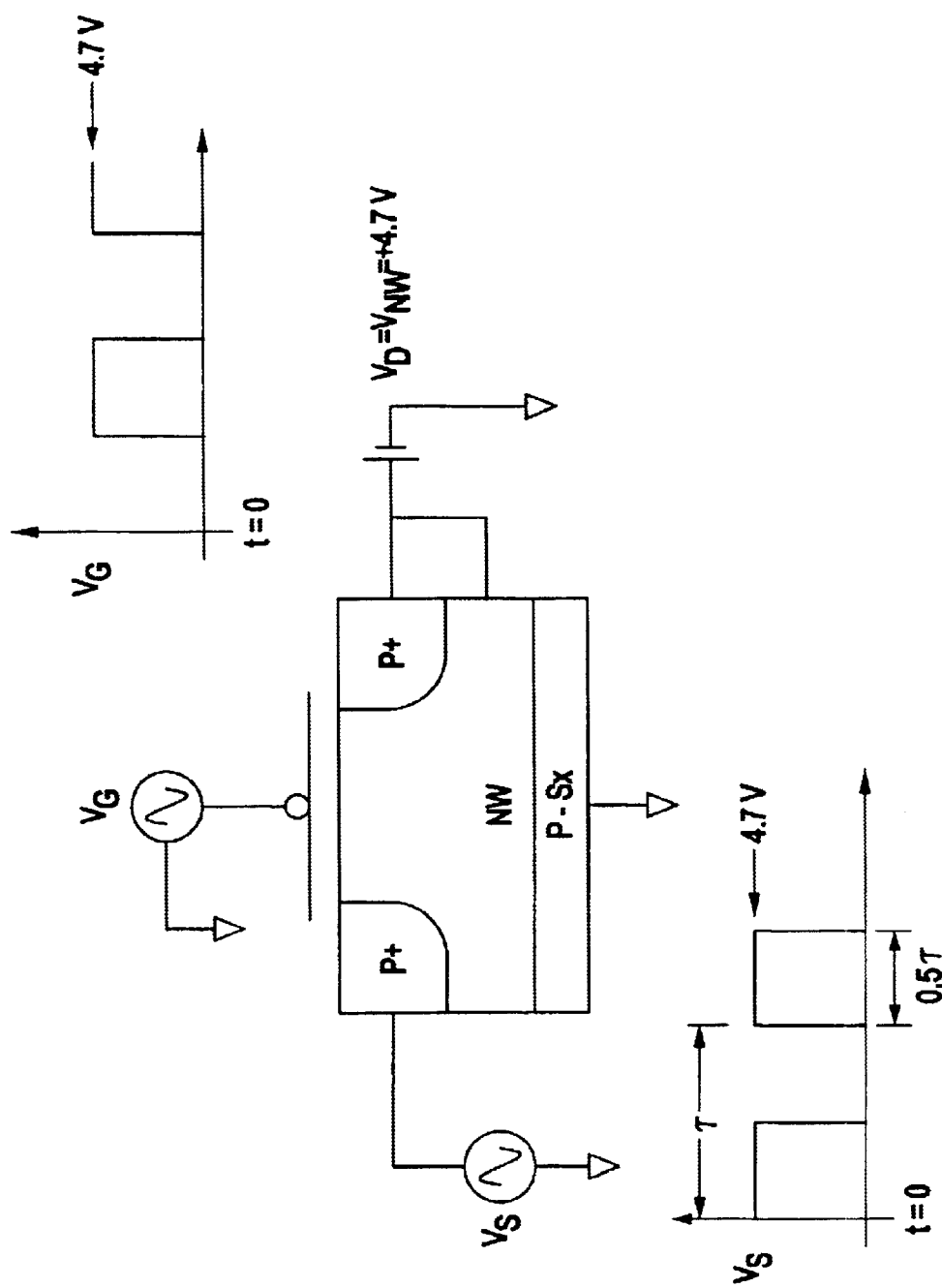
FIG. 10 shows the AC pulsed stress configuration for the PFET.

FIG. 10 shows the AC pulsed stress configuration for the PFET 10. Drain 14 and n-well 12 are kept at constant potential 103 of +4.7 V. Source 13 receives input waveform 101 of pulses. Gate 15 receives input waveform 102 of pulses out of phase with the source input waveform.

Figure 11:
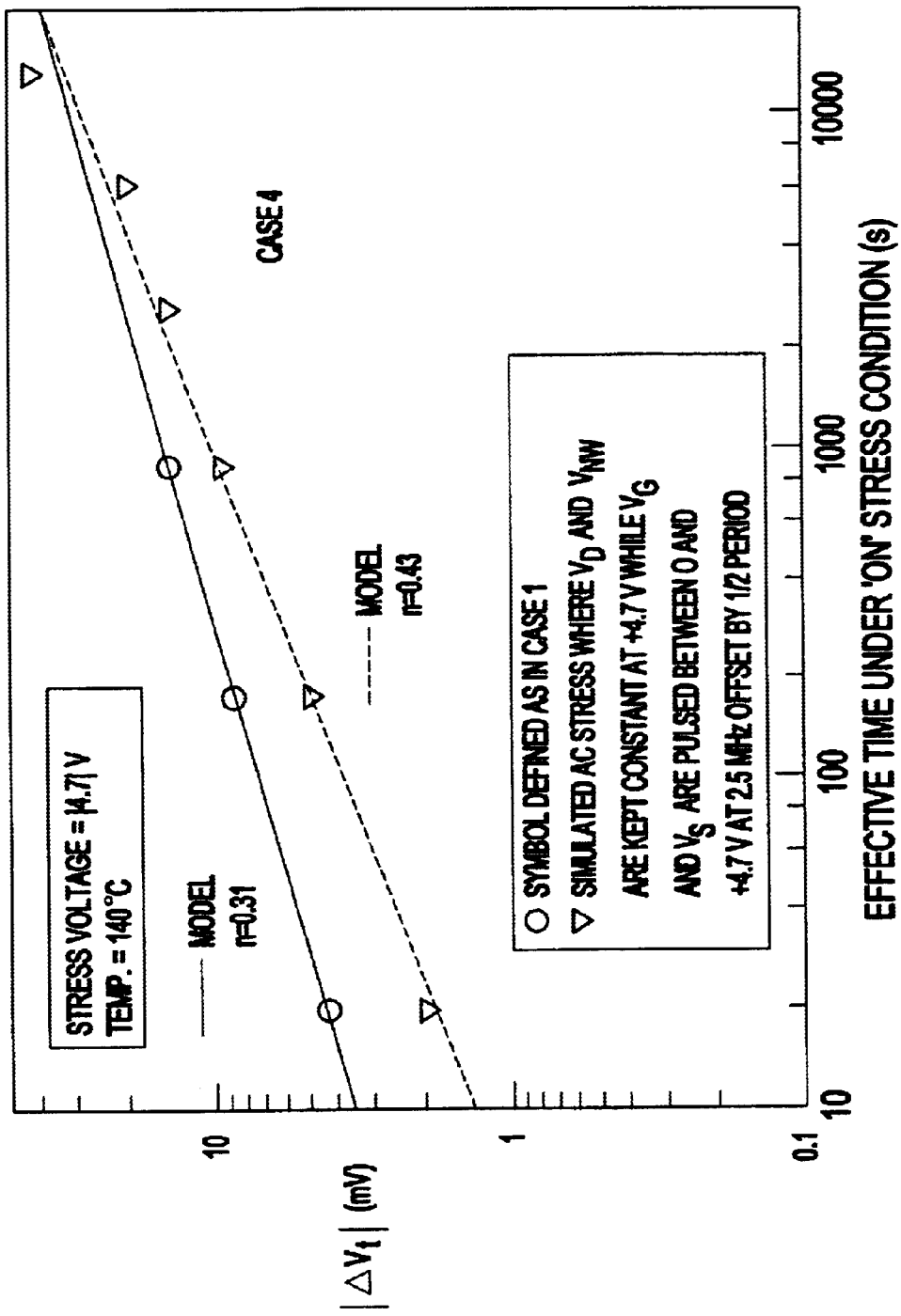
FIG. 11 shows $|Î"V_{th}|$ versus effective time under "ON" stress for Case 4.

FIG. 11 shows the behavior of $|\hat{I}"V_{th}|$ as measured at various readouts 111 for the PFET under the AC pulsed stressing with the X-axis as the effective time under "ON" stress condition, which means that the intervals of "OFF" stressing (50% of real time for each cycle) were not included. FIG. 11 also includes the data 112 in Case 3 for the condition where the "ON" stressing was not interrupted by "OFF" stressing. As indicated in FIG. 11, the time exponent factor for the AC pulsed stress configuration is 0.43, which is higher than the exponent factor for the DC "ON" stress (0.31). This result indicates that under these conditions, the AC pulsed stress configuration over time gives a net higher $|\hat{I}"V_{th}|$ than predicted by DC stressing.

It is concluded from all the cases investigated above that the actual degradation of the PFET due to the NBTI mechanism, under AC pulsed conditions, shows a more complicated behavior than what would be predicted by DC stressing alone. For this reason it is important to design a system which can accurately measure the effect of the NBTI mechanism on the performance of CMOS circuits, under actual operating conditions of frequency, duty factors, and technology/processing interactions. It is also important that this system be capable of investigating the effect of changes in the operating conditions like frequency and duty factor. In the system employed in this art, which will now be introduced, the output pulse delay is the measurement for the effect of the NBTI mechanism on the circuit performance.

The circuit of the present invention uses self-resetting dynamic logic to create a pulse propagator circuit for the evaluation of the effect of duty cycle on circuit performance. This pulse propagator incorporates a programmable reset delay to vary the propagated pulse width from approximately 20% to 80% of the total cycle time.

Figure 12:
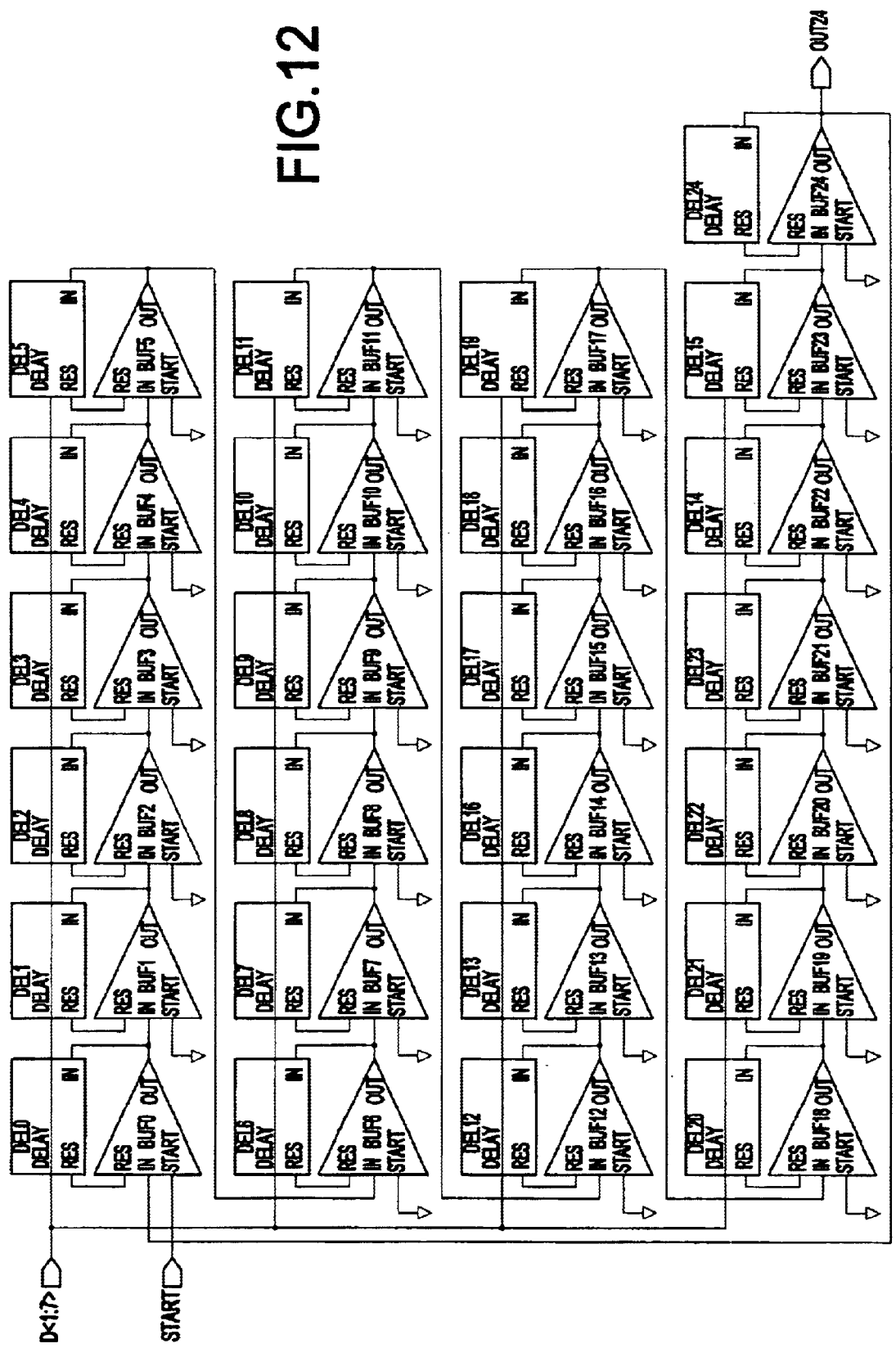
FIG. 12 illustrates an exemplary top-level pulse propagator circuit.

FIG. 12 illustrates the top-level circuit elements which form the pulse propagator circuit 120 which is a first exemplary embodiment of the present invention. This circuit may be compared to a ring oscillator. In a ring oscillator, an odd number of inverter stages are connected in an infinite loop. The odd number of inverters causes the output of each inverter stage to oscillate at a fixed duty cycle. The duty cycle of a ring oscillator is generally very close to 50% and is not programmable.

Like a ring oscillator, the pulse propagator 120 operates as an infinite loop since node OUT24, the output of the last propagator stage BUF24 (121), is also the input to BUFO, the first propagator stage 122. Unlike a ring oscillator, however, each stage of the pulse propagator is a non-inverting dynamic buffer stage rather than an inverter. The pulse propagator therefore requires a pulsed START input 123 to cause the first buffer stage 122 to evaluate and propagate a pulse to subsequent buffer stages. Given a single START pulse, the pulse propagator will subsequently oscillate in an infinite loop. The START pulse may be generated externally, or generated on-chip from an external trigger. Inputs D<1:7> (see label 124) of FIG. 12 control the programmable reset delay 125 of the pulse propagator.

Figure 13:
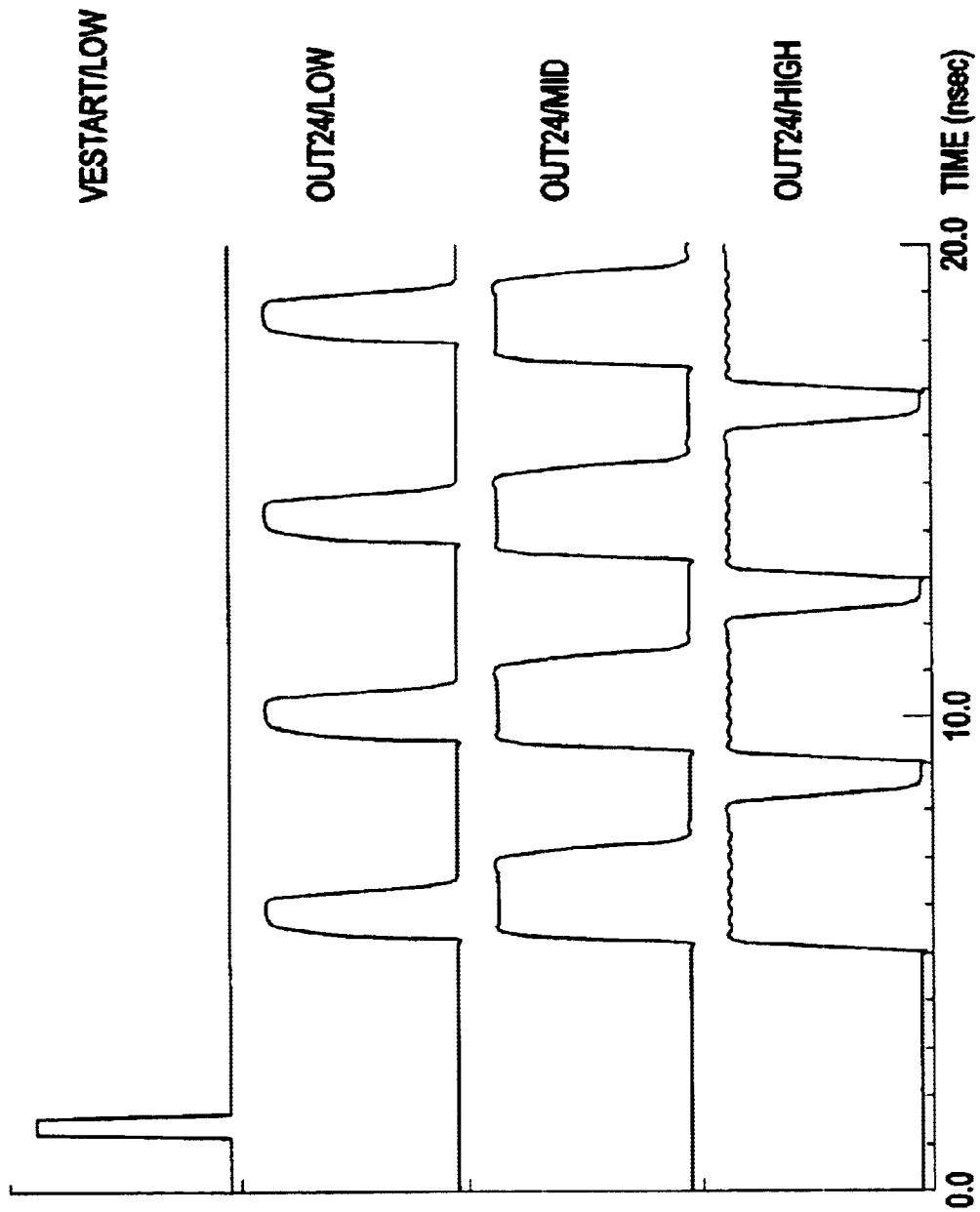
FIG. 13 illustrates the operation of the pulse propagator for three different control settings.

FIG. 13 illustrates the operation of the pulse propagator 120 for three different settings of these controls 124. The first wave form 130 ("VESTART/low") provides the START input pulse input 123 shown in FIG. 12. The second wave form 131 ("OUT24/low") illustrates the duty cycle of the output when the reset delay is set to a minimum, i.e., D<1:7>="0000000". The minimum duty factor, as the "OUT24/low" wave form illustrates, is approximately 20%. The third wave form 132 ("OUT24/mid") illustrates the duty cycle of the output when the reset delay is set to the mid point, or D<1:7>="1111000". The mid point duty factor illustrated by wave form "OUT24/mid" is approximately 50%. The final wave form 133 ("OUT24/high") illustrates the duty cycle of the output when the reset delay is set to the maximum, or D<1:7>="1111111". The maximum duty factor illustrated by wave form "OUT24/high" is approximately 80%.

Figure 14:
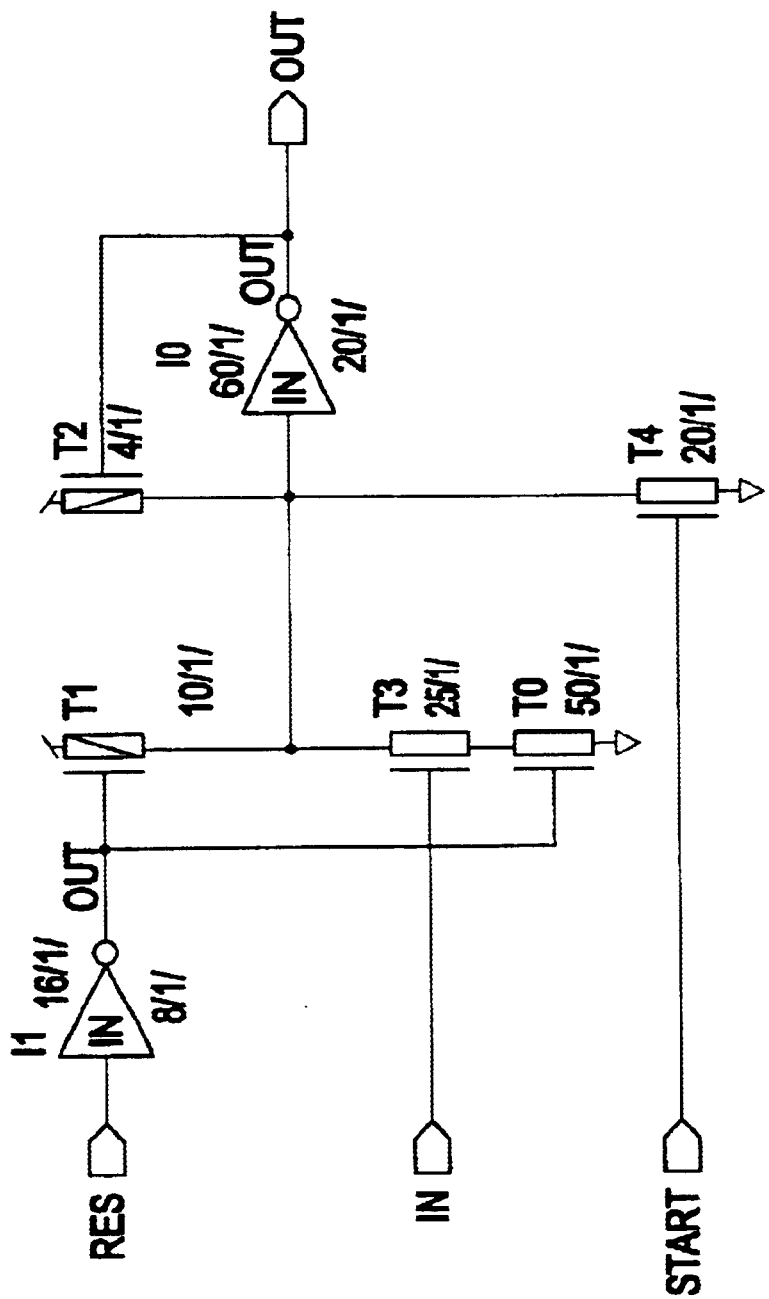
FIG. 14 illustrates the dynamic self-resetting buffer circuit element used in the pulse propagator.

FIG. 14 illustrates the dynamic self-resetting buffer circuit element (e.g., 121, 122 of FIG. 12) used in the pulse propagator circuit. Prior to propagating a pulse, the RES input is low, causing PFET device T1 to be off and NFET device T0 to be active. Node OUT is low, causing the primary dynamic node to be held high by PFET device T2. When a high-going pulse is applied to node IN, device T3 becomes active, causing the primary dynamic node to evaluate low. Node OUT transitions high during this evaluation. The pulse on node IN then transitions low and node OUT remains high until the RES input pulses high.

Figure 15:
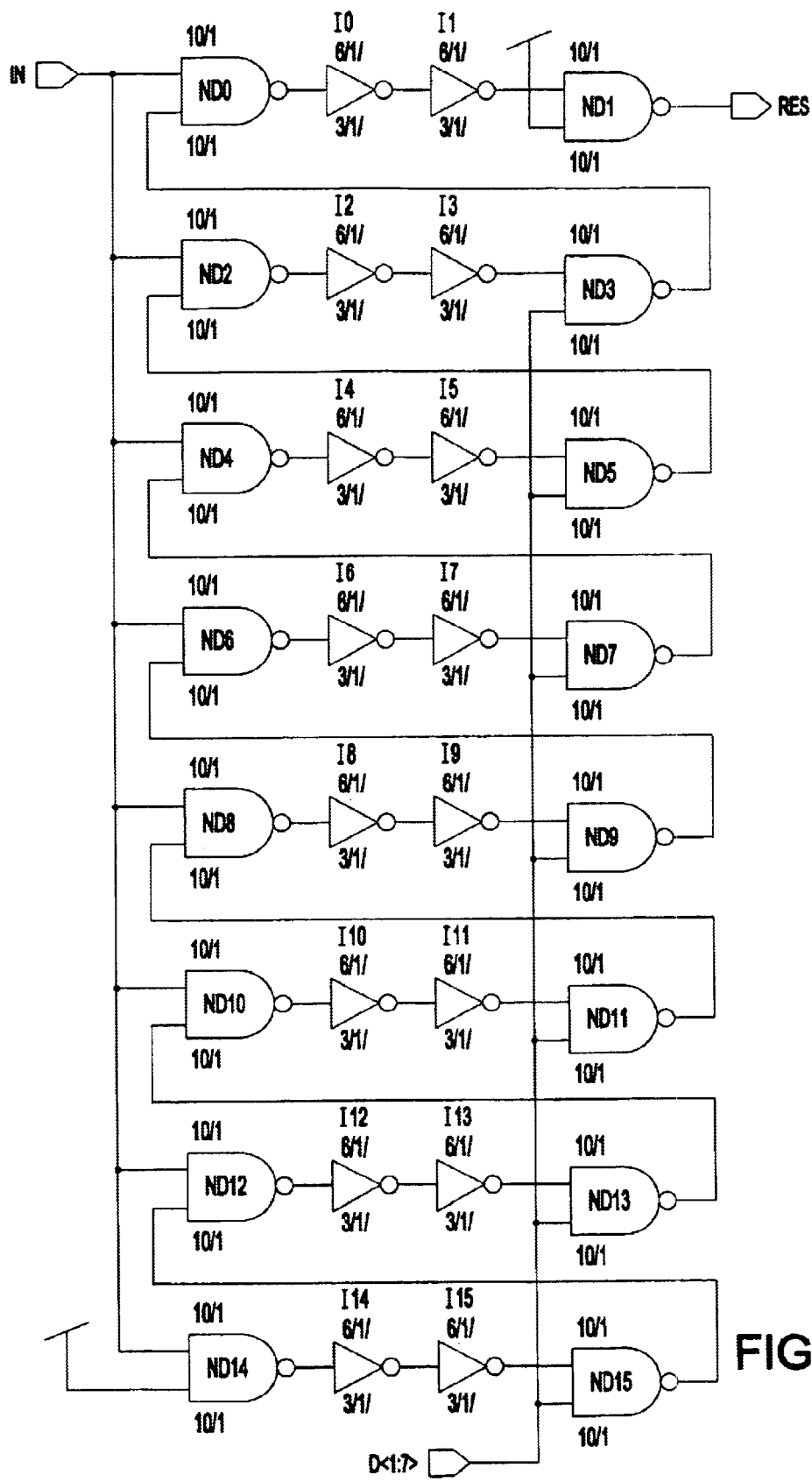
FIG. 15 illustrates the programmable reset delay circuit.

FIG. 15 illustrates the programmable reset delay circuit (e.g., 125 in FIG. 12). This circuit determines the delay between the high transition of the dynamic self-resetting buffer output and the generation of a reset pulse to restore the buffer for the next pulse propagation. The IN input node of this circuit is connected to the OUT output of the dynamic buffer. The RES output of the programmable delay circuit is the RES input to the dynamic buffer. The programmable delay circuit uses a "thermometer code" delay decode method where D<1:7>="0000000" is the minimum delay count. Subsequent counts of 1, 2, 3, 4, etc., are of the form "1000000", "1100000", "1110000", and "1111000", respectively. Therefore, the circuit taught in FIGS. 12–15 can be used to provide a means to stress and monitor results of the NBTI effect in a representative logic path circuit, as embodied in the Ring Oscillator structure.

Figure 16:
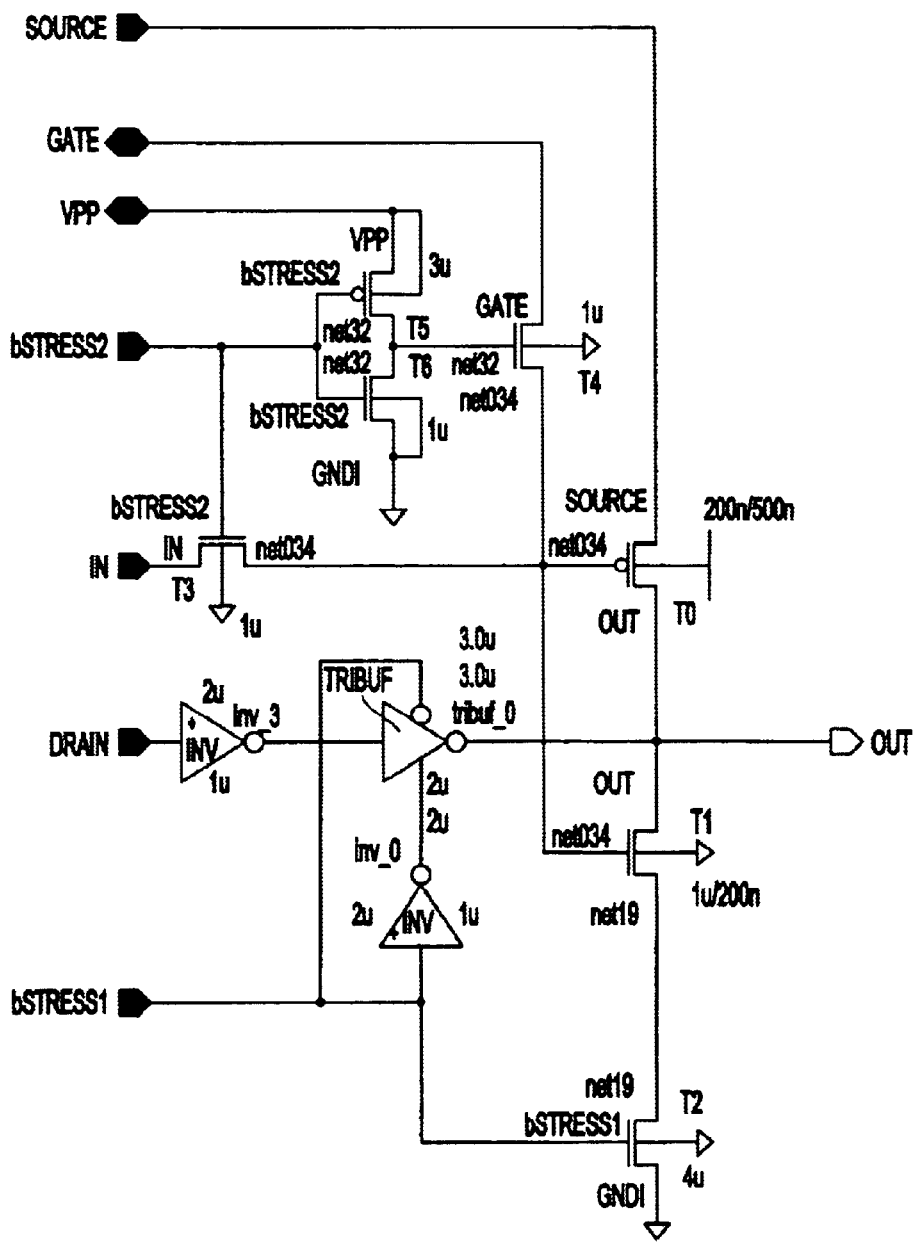
FIG. 16 shows another exemplary circuit to further expand the level of stress control while isolating the performance path to only that PFET which is stressed for the NBTI effect.

Another circuit 160 which can further expand the level of stress control while providing isolation of the performance path to only that PFET which is stressed for the NBTI effect, is shown in FIG. 16 as a second exemplary embodiment of the present invention. The target device 161 is a PFET (labeled T0) which can be isolated as per the truth table shown in the figure for DC, AC, or free-run stress configurations. Then with the proper input levels as per the truth table 162, each such circuit 160, 160' shown in FIG. 16 can be electrically interconnected to a neighbor into a ring oscillator 170 shown in FIG. 17, which allows a measurement of pre- and post-stress frequencies to be compared.

Figure 18:
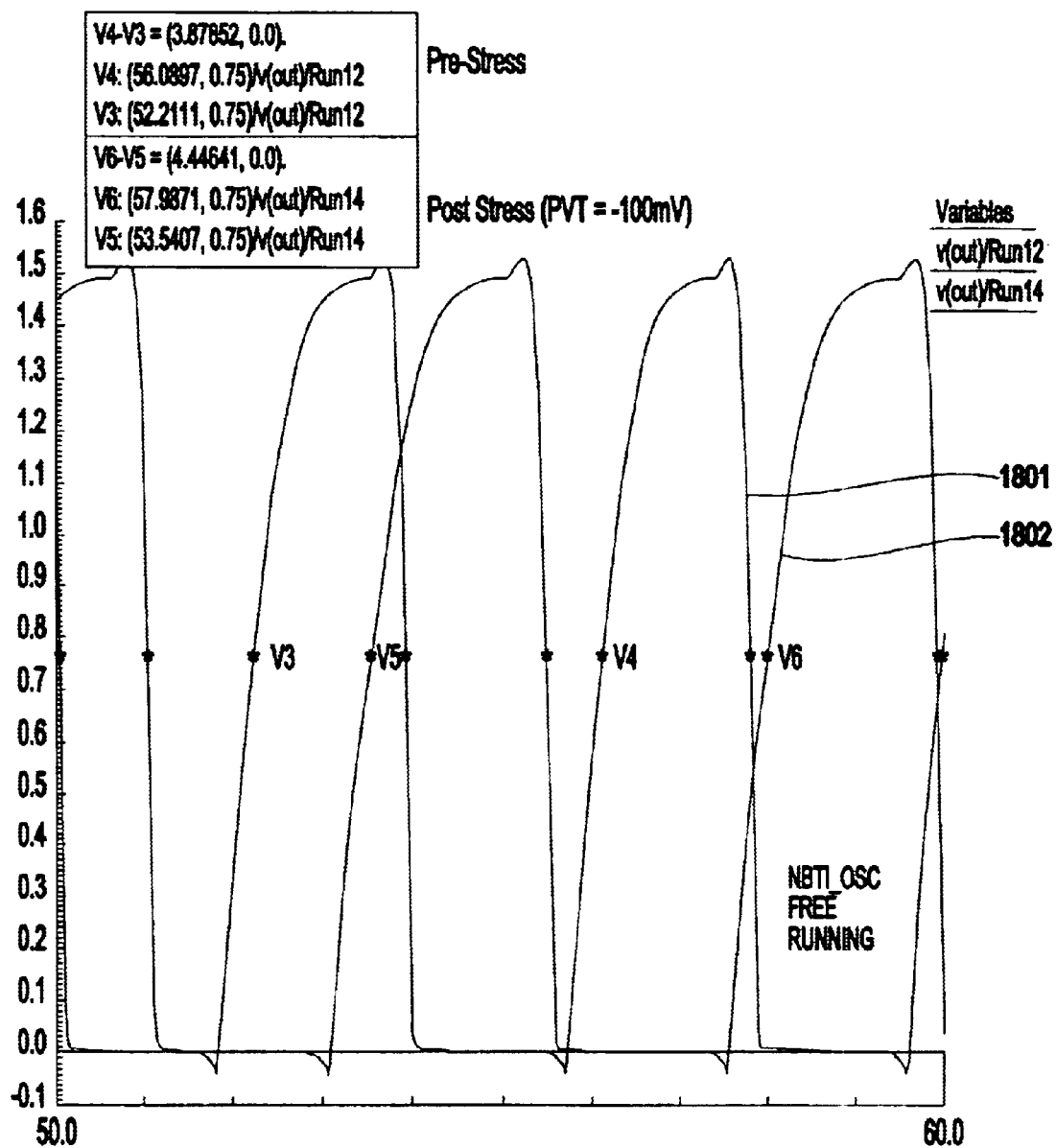
FIG. 18 shows exemplary samples of such waveforms from the circuit in FIG. 17.

FIG. 18 shows an example of such waveforms for this circuit in which a pre-stress wave form 1801 is superimposed on post-stress wave form 1802. Note that the oscillator runs at 250+Mhz in its pre-stress operation. This performance is well in the range of today's high performance digital circuits.

The requirements for the highest degree of stress flexibility and applicability are:

1.) Ring oscillator circuit which is used to measure pre/post stress period.
2.) Ring oscillator circuit in which a single PFET per stage is in the performance path.
3.) A test means by which said PFET per stage can be isolated from the ring oscillator circuit structure.
4.) A test means by which said PFET per stage can be stressed in a DC on/off mode.
5.) An alternate test means by which said PFET can be stressed in an AC mode by applying a gate pulse of selectable frequency and/or duty factor.
6.) A test means by which said PFET having been either DC, AC, a combination of DC and AC stresses, or a free-run stress can then be electrically reconnected into the ring oscillator circuit.
7.) The ring oscillator frequency shift then being correlated to a Vth shift previously determined by stress of identical PFET devices.
8.) The Ring Oscillator frequency shift being correlated to a Vth shift determined by sample measurement of said PFET devices via probe pads S1–S4 as shown on FIG. 17.

Figure 17:
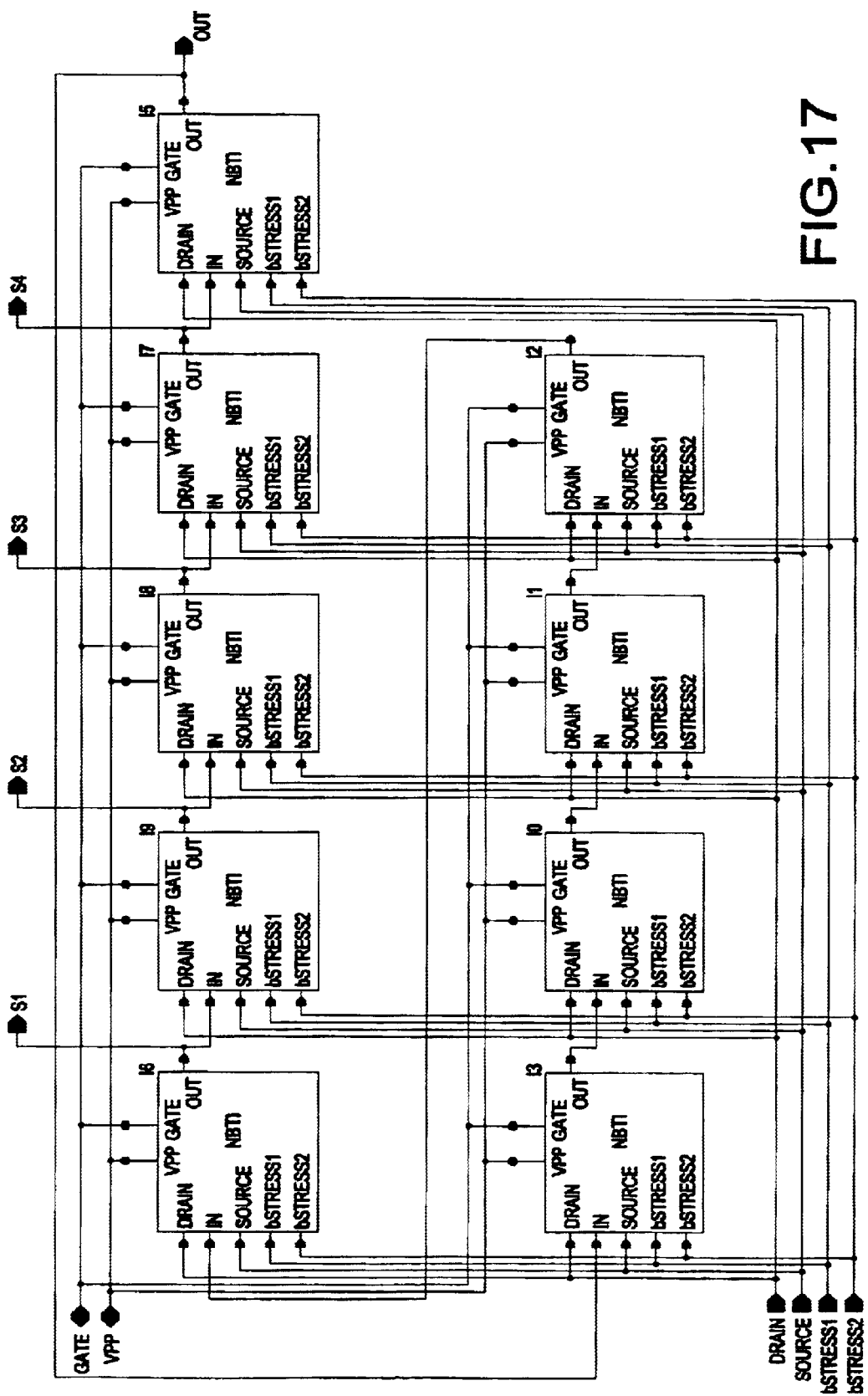
FIG. 17 shows an exemplary ring oscillator in which pre- and post-stress frequencies can be compared.

FIG. 18 shows the output of the ring oscillator 170 of FIG. 17, which is constructed from nine stages of the circuit 160 shown in FIG. 16. The Pre-stress frequency of this oscillator runs at 258 Mhz for typical process and voltage, at 85 C. The nine stages are then stressed in parallel as per the truth table in FIG. 16. Assuming that delta Vth=–100 mV in each target device in each stage, in response to a given stress, the oscillator frequency is shown to slow to 225 MHz. This is a reduction of nearly 14%. Therefore a circuit means is shown which allows the unambiguous stress and characterization of the NBTI effect in P+ gated PFETs.

The circuit shown in FIG. 16 consists of the target device (T0), the I/O pins (SOURCE, GATE, VPP, IN, DRAIN and OUT) and the stress control pins (bSTRESS1, bSTRESS2). The gate path of target device T0 is controlled by the bSTRESS2 input. The drain path is controlled by bSTRESS1. The SOURCE is directly accessed from the pads of the test site on which the overall circuit (FIG. 17) would reside.

Figure 1:
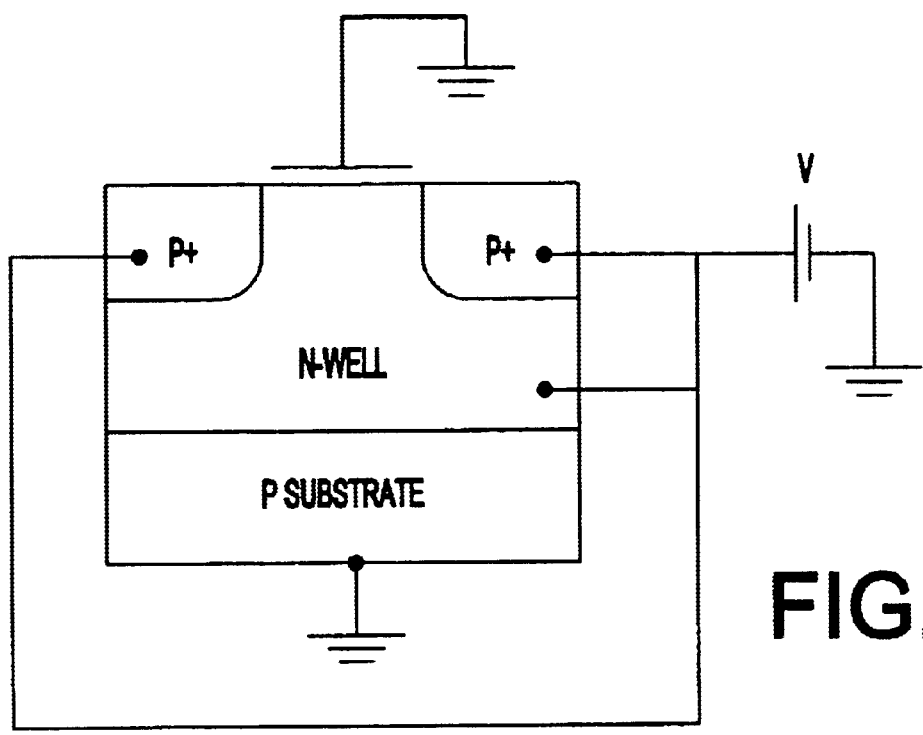
FIG. 1 shows the PFET bias configuration for NBTI "ON" stress.
Figure 2:
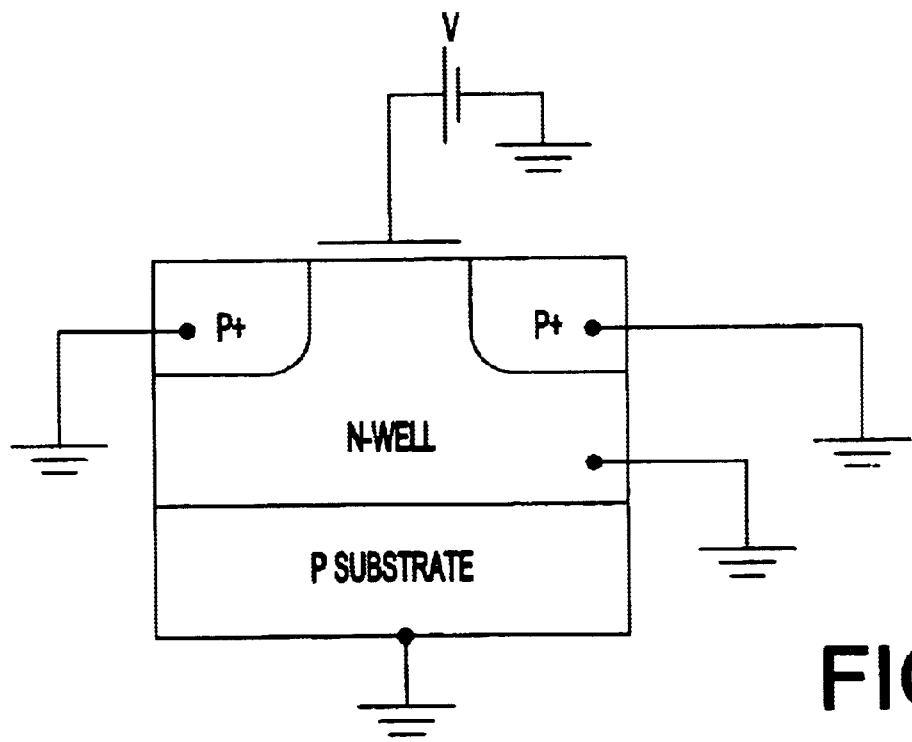
FIG. 2 shows an alternate bias configuration for the NBTI "ON" stress.
Figure 3:
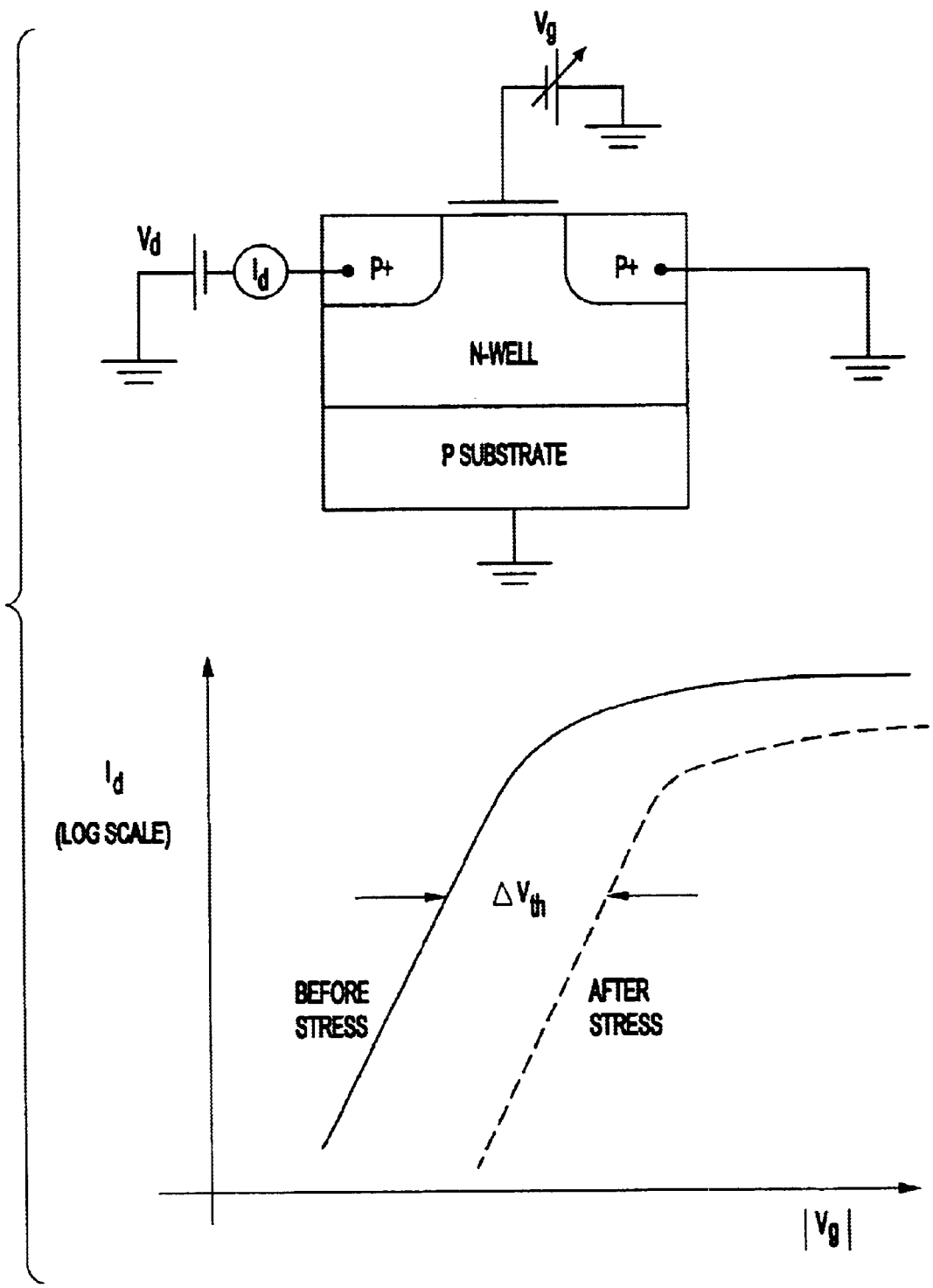
FIG. 3 shows a testing circuit schematic and the threshold voltage shift due to the NBTI mechanism.
Figure 4:
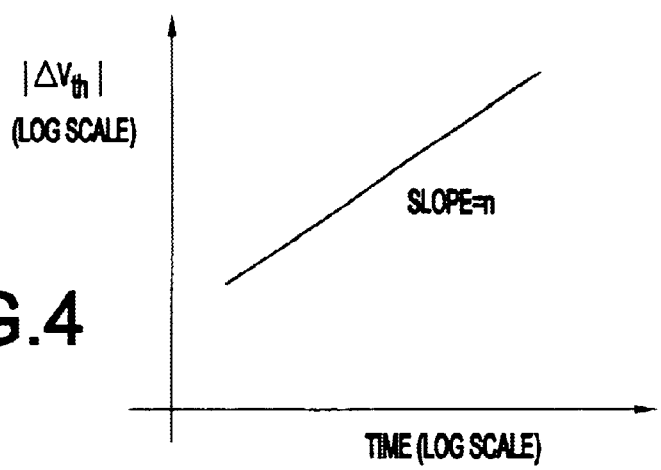
FIG. 4 shows the power law relationship for $|Î"V_{th}|$ versus stress time.
Figure 5:
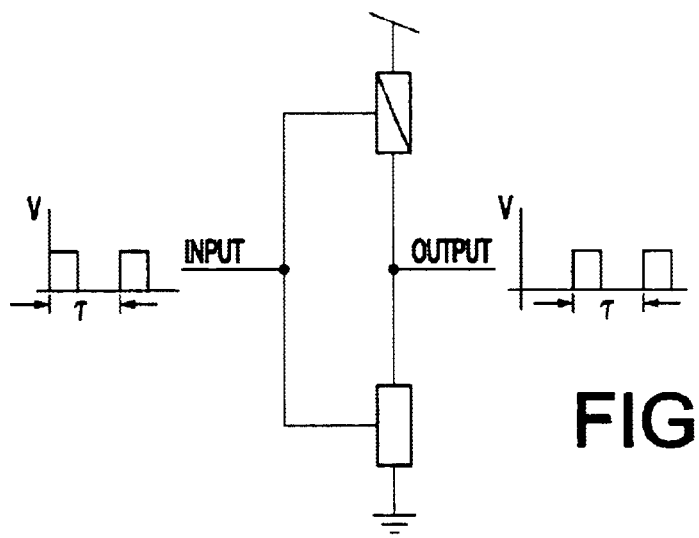
FIG. 5 shows a CMOS inverter showing stress conditions for the PFEF.
Figure 6:
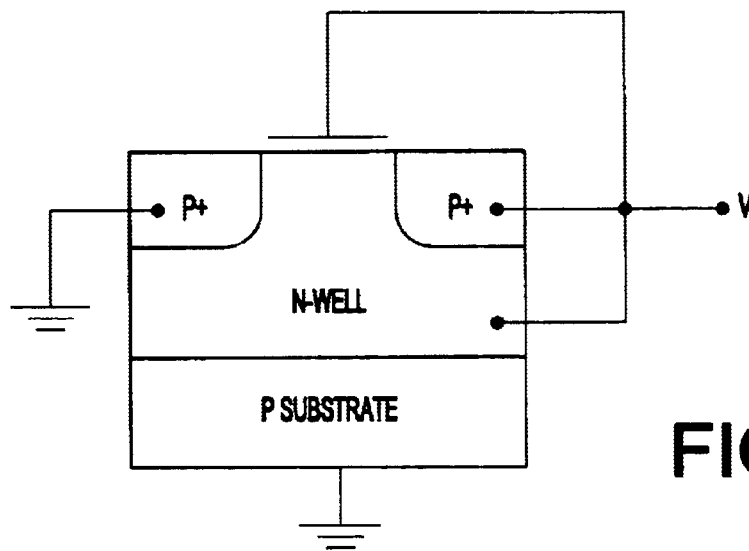
FIG. 6 shows a PFET bias configuration for the NBTI "OFF" stress.

DC Stress Conditions:

As per the truth table 162 on FIG. 16, if an "ON" stress (GATE=0, SOURCE=DRAIN=1) as in FIG. 1 of disclosure is desired, the bSTRESS2 input is tied LOW.

This turns OFF device T3 and isolates PFET T0 gate (net034) from the ring oscillator path. At the same time, device T6 turns OFF and T5 charges the gate of pass gate T4 to VPP, thus connecting T0 gate to the GATE input pin.

Also, the bSTRESS1 input is tied LOW. This turns device T2 OFF and enables TRIBUF_. With the DRAIN input HIGH, the drain of T0 (OUT) is held high. With SOURCE held HIGH from it's pad, the target PFET device T0 is in the "ON" DC stress configuration. An alternating ON/OFF DC stress can also be applied in this mode by switching the GATE to a HIGH level and switching the SOURCE and DRAIN inputs to the LOW level after the desired time under ON Stress has been met. The device can then be held in the OFF stress for the desired duration until the GATE, SOURCE, DRAIN could be switched again to the ON state stress. All stages of the ring oscillator then see this stress in parallel. Subsequent bias of the ring oscillator inputs to Free Run mode then allow measurement of the oscillator frequency and the effect of the stress.

AC Stress Conditions:

An AC Stress which simulates the AC biases of the device in the Free Running ring oscillator, can be run as per the truth table 162 in FIG. 16. In this mode, devices T0, T1, T2 operate as an inverter, isolated from the ring oscillator connectivity. The inverter AC operation now allows the target device to be stressed in an NBTI AC mode. This mode is activated by the application of a LOW level to bSTRESS2 as for the DC Stress mode. This again results in control of T0 gate from the GATE input through device T4. The SOURCE is held HIGH. The bSTRESS1 input is also held HIGH. This puts the TRIBUF in Tri-state while turning device T2 ON, creating the inverter discharge path through device T1. The DRAIN input is also held high to turn the TRIBUF PFET stack OFF. The GATE input can then be toggled at the desired frequency and/or duty factor as controlled from the test site pads. Subsequent bias of the Ring Oscillator inputs to Free Run mode then allow measurement of the oscillator frequency and the effect of the stress. The Free Run mode can also be used alone as a stress configuration.

The goal of the enhanced NBTI stress and characterization circuit is to provide for the unambiguous stress and characterization of the target PFET. As such, this PFET is designed as a narrow width/long channel device, in keeping with preliminary results showing these devices to be most susceptible to the NBTI effect. This then creates the further requirement of using small geometry devices in the ring oscillator in order to provide for high frequency operation via minimization of oscillator stage loads. Other circuits designed with wider/shorter devices could be useful to verify the NBTI effect in those devices without departing from the intent of this invention.

Hence, since it is required that a single target device be uniquely stressed, all pass gate logic in the ring oscillator path must be made with NFETs as per devices T1, T2 and T3. Devices T2 and T3 may be designed with minimum channel devices, since they will see low Vds values during their charging/discharging of their respective nodes. This then minimizes the potential for channel hot carrier effects that could result in unintended NFET Vth shifts, which could then make stress results non-unique. For this case, device T1 has it's channel increased from the 120 nm minimum.

The Channel Hot Carrier (CHC) concern is also addressed for the target PFET T0 in the AC stress mode. Since the target device is 500 nm long, the CHC effect will be reduced exponentially. Also, the isolation of the output (OUT) from the input of the next stage (n+1) due to it's input device T3 being off, allows the rapid rise time/fall time (tR/tF) of the node OUT. Rapid tR/tF results in low Vds duration during the AC stress, further eliminating the CHC effect.

Figure 19:
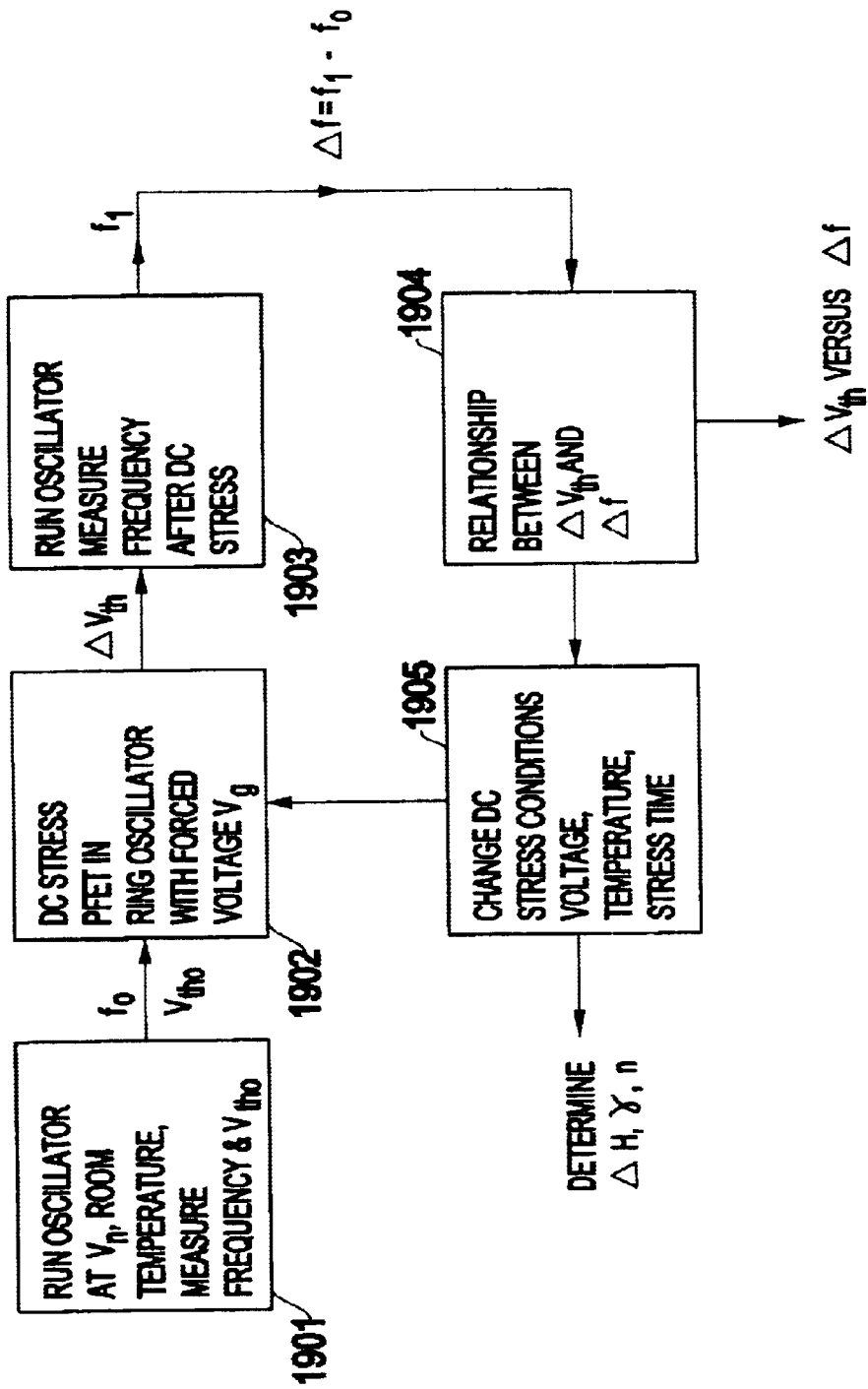
FIG. 19 shows the procedure for the application of PFET DC stress in the ring oscillator circuit and determining of the degradation model constants.

FIG. 19 shows one example of how the present invention can be used to further investigate the NBTI phenomena. The example demonstrates how the invention could be used to correlate a change in threshold voltage, under the application of a DC stress, to a change in frequency of the ring oscillator taught in this invention. Other examples should be obvious to a person of ordinary skill in the art.

In FIG. 19, the PFET under evaluation is incorporated into the circuit of the present invention. In step 1901 the initial threshold voltage $V_{th0}$ and initial frequency of the ring oscillato $f_0$ are measured. This PFET device is then subjected in step 1902 to a DC stress test by subjecting it to preselected test values including values for Vg, Vd, and Vs, and the change in threshold voltage ($Î"V_{th}$) due to DC stress is determined. In step 1903 the oscillation frequency f1 of the ring oscillator following the DC stress is determined, from which the change in frequency ($Î"V_{th}$) due to the DC stress is calculated. The measurements allow a calculation and correlation of $Î"V_{th}$ and $Î"f$ (step 1904). Thereinafter, the parameters can be changed (step 1905) and the DC stress repeated as desired. The final results, with all measurements using desired conditions of voltage, temperature and stress time having been completed, should yield the following constants of the $Î"V_{th}$ model: $Î"H, Î^3$, and n.

Figure 20:
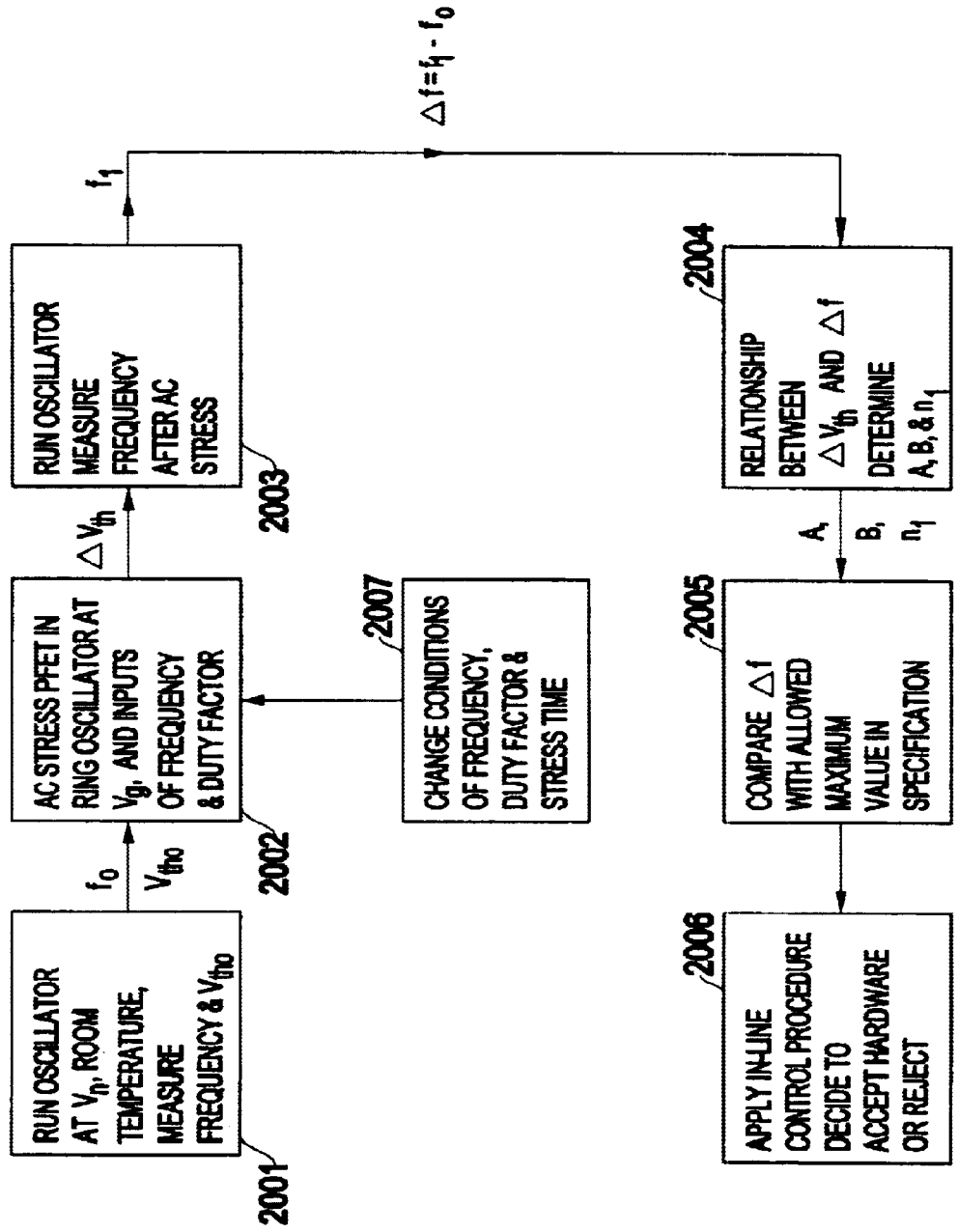
FIG. 20 shows the procedure for the application of PFET AC stress in the ring oscillator circuit and procedure for implementation of in-line control on manufacturing hardware.

FIG. 20 shows one example of how the present invention can be used to further investigate the NBTI phenomena. The example demonstrates how the invention could be used to correlate a change in PFET threshold voltage, under the application of an AC stress, to change in frequency of the ring oscillator taught in this invention. Also FIG. 20 shows one example of how the present invention can be employed for reliability manufacturing in-line control of hardware using the measured change in frequency of the ring oscillator due to an AC stress. Other examples should be obvious to a person of ordinary skill in the art.

In FIG. 20 the PFET under evaluation is incorporated into the circuit of the present invention. In step 2001 the initial threshold voltage Vth0 and initial frequency of the ring oscillator $f_0$ are measured. This PFET device is then subjected in step 2002 to an AC stress test by subjecting it to preselected test values including values for frequency, duty factor DF, stress time, and stress voltage Vg. The change in threshold voltage $Î"V_{th}$ due to AC stress is determined. In step 2003 the oscillation frequency following the DC stress f1 is determined, from which the change in frequency due to DC stress ($Î"f$) is calculated. The measurements allow a calculation and correlation of $Î"V_{th}$ and $Î"f$ (step 2004).

From this correlation, a constant B is determined, whose significance will be shortly described (equation 4). Also in step 2007 conditions for frequency, duty factor, and stress times can be changed, and the constants A and n1 are determined, where A is a constant associated with the AC stress and n1 is the time exponent under AC stress conditions (equation 2 will be discussed shortly). In step 2005 the change in frequency $Î"f$ is compared with predetermined maximum allowed value or values based on preexisting specifications. In step 2006 the preset procedures for manufacturing in-line control are applied and a decision is made whether or not to accept the hardware.

To further develop the model for NBTI in accordance with the present invention, the results of the testing and AC stressing of the circuit utilized in this system are then expressed in the following bench mark model:

$$\Delta V_{th}(AC) = A \times e^{(-\Delta H/KT)} \times (W)^{-m} \times \Delta V_{th}(CYCLE) \times t_{eq}^{n1} \quad \text{(Equation 2)}$$

Equation 2 gives the method of calculating $Î"V_{th}$ (AC) which is the change in threshold voltage of a PFET in a preselected circuit under any desired AC application conditions. In the above equation, $Î"H$ is again the activation energy determined from the system measured degradation ($Î"f$) at different temperatures. The factor m is determined from the dependence of the degradation on PFET device width (AC mode), and typically has a value of about 0.1 or less, n1 is the time exponent under AC stress conditions. T is the operating temperature of interest and K is Boltzmann's constant. A is a constant depending on the specific technology and its integral effect on the NBTI degradation mechanism. The constants A and n1, which are the degradation constants under AC stress conditions, are determined according to the procedure described in the flowchart in FIG. 20.

The term $Î"V_{th}$ (CYCLE) is the average effect, measured over one cycle, of the exponential effect of gate voltage, and is given by:

$$\Delta V_{th}(CYCLE) = (1/V_n) \times \int_0^{V_n} e^{(-\gamma Tox/Vg)} dV_g, \quad \text{(Equation 3)}$$

where Vn is the intended voltage for circuit applications, $Î^3$ is the voltage acceleration determined from measuring the circuit degradation ($Î"f$) at different supply voltages, as shown in FIG. 19. Tox is the electrical effective oxide thickness for the technology in question. Vg is the gate voltage under AC stress described in the flowchart of FIG. 20. The integration is carried out only in the situations where that gate voltage is lower than the voltage of either or both of the source and drain voltages, i.e., only when the NBTI mechanism is active. Otherwise, no integration is carried out for other parts of the cycle time where this condition is not present.

The equivalent stress time over the intended useful life time for the applications teq is given by:

$$t_{eq} = B \times (f_{sw}, f_{cl}) t_{use} \quad \text{(Equation 4)}$$

Here, B is a constant determined from the results of the flowchart in FIG. 20, based on the degradation measured at different values of duty factor in the range of interest of the frequency for the circuit application in question. $f_{sw}$ is the average switching frequency for the gate voltage to be lower than the voltage of either or both of the source and drain diffusions. $f_{cl}$ is the clock frequency and $t_{use}$ is the actual use time. The exponent n1 is determined from the method shown in FIG. 20 by comparing the degradation results at different AC stress times. The parameters $t_{use}$, $f_{cl}$, and $f_{sw}$ are predetermined from intended application conditions of the circuit in question.

The present invention provides a method of determining the magnitude and behavior of the degradation due to the NBTI mechanism under any desired AC conditions of voltage, duty factor, and frequency of any intended circuit applications. It also permits a determination of the difference between the degradation due to the NBTI mechanism under DC and AC conditions.

The present invention also provides a way to determine the effect of the degradation due to the NBTI mechanism on technology scaling under actual AC operating conditions and from which an optimum and realistic path for technology scaling could be arrived at. It also provides a procedure and methodology according to which a reliability in-line manufacturing control system is achieved to protect manufactured goods from any undesired degradation due to the NBTI mechanism.

While the invention has been described in terms of a single preferred embodiment, those skilled in the art will recognize that the invention can be practiced with modification within the spirit and scope of the appended claims.

What is claimed is:

1. A ring oscillator comprising an odd number of elements interconnected in a serially-connected infinite loop, each said element having an associated delay unit, each said delay unit having a programmable delay.

2. The ring oscillator of claim 1, further comprising:
an input to receive an input signal to start an oscillation of said ring oscillator.

3. The ring oscillator of claim 1, further comprising:
an input to receive an input signal to program each said programmable delay.

4. The ring oscillator of claim 1, wherein each said element comprises a non-inverting amplifier.

5. The ring oscillator of claim 1, wherein said input for said programmable delay provides an adjustment of a duty factor of an output signal of said ring oscillator.

6. The ring oscillator of claim 1, wherein each said element comprises at least one complementary metal oxide semiconductor (CMOS) inverter.

7. The ring oscillator of claim 3, wherein said programmable delay comprises a binary word serving as a vector input.

8. A circuit for testing effects of Negative Bias Temperature Instability (NBTI) on an integrated circuit, said circuit comprising:
a ring oscillator according to claim 1.

9. A test circuit to measure a Negative Bias Temperature Instability (NBTI) effect for PFETs (p-channel MOSFET) by stressing a target PFET component with at least one stress condition, said target PFET component being integrated as a component into said test circuit, said target PFET component having a source, a drain, and a gate, said test circuit comprising:
a ring oscillator comprising an odd number of oscillator elements interconnected serially in an infinite loop, wherein at least one said target PFET component is integrated into said ring oscillator, said target PFET being integrated into said ring oscillator in such configuration that hot carrier effects from other components in said test circuit do not affect said NBTI effect; and a test output providing a point to measure at least one parameter of said ring oscillator.

10. The NBTI test circuit of claim 9, wherein each said oscillator element contains at least one said target PFET.

11. The NBTI test circuit of claim 9, further comprising:
a switching circuit to selectively switch said at least one stress condition onto said target PFET.

12. The NBTI test circuit of claim 11, wherein said at least one stress condition comprises at least one of:
a DC stress, wherein said target PFET receives a first constant voltage level on said gate and a second constant voltage level on said source and drain;
an AC stress, wherein said target PFET receives a varying voltage on said gate; and
a free running mode, wherein said target PFET receives a varying complementary voltage on said drain and said gate.

13. The NBTI test circuit of claim 11, wherein said target PFET 13 is stressed by an AC stress by selectively applying a gate pulse, said gate pulse being adjustable in at least one of frequency and duty factor.

14. A method of testing a PFET (p-channel field effect transistor), comprising:
incorporating a target PFET into a ring oscillator having an odd number of elements;
performing at least one stress test on said PFET; and
measuring at least one characteristic of said ring oscillator based on independently controlling both a frequency parameter and a duty factor parameter of said ring oscillator.

15. The method of claim 14, wherein said each said ring oscillator element contains a variable delay.

16. The method of claim 14, wherein said test measurement determines an NBTI (negative bias temperature instability) effect on at least one said target PFET.

17. The method of claim 14, wherein said test measurement is for adjusting a design of MOSFET devices, said method further comprising:
systematically performing at least one stress test on said target PFET; and
taking at least one measurement of each said at least one stress test; and
using said at least one measurement to modify a design parameter of said target PFET.

18. The method of claim 17, wherein said design parameter is used for at least one of correcting a manufacturing process and improving a design characteristic.

19. The method of claim 14, wherein said test is for one of predicting and improving a reliability of one or more MOSFET devices having a structure similar to said target PFET.

20. The method of claim 14, wherein said test is for one of predicting and improving a degradation over time of one or more MOSFET devices similar to said target PFET.

* * * * *